(12) United States Patent
Morikawa et al.

(10) Patent No.: US 8,513,640 B2
(45) Date of Patent: Aug. 20, 2013

(54) SEMICONDUCTOR DEVICE

(75) Inventors: Takahiro Morikawa, Hachioji (JP);
Motoyasu Terao, Hinodemachi (JP);
Norikatsu Takaura, Tokyo (JP); Kenzo Kurotsuchi, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 856 days.

(21) Appl. No.: 12/094,403

(22) PCT Filed: Nov. 14, 2006

(86) PCT No.: PCT/JP2006/322667
§ 371 (c)(1),
(2), (4) Date: Mar. 23, 2009

(87) PCT Pub. No.: WO2007/058175
PCT Pub. Date: May 24, 2007

(65) Prior Publication Data
US 2009/0302293 A1    Dec. 10, 2009

(30) Foreign Application Priority Data
Nov. 21, 2005  (WO) .................. PCT/JP2005/021360

(51) Int. Cl.
*H01L 29/06*  (2006.01)
*H01L 21/00*  (2006.01)

(52) U.S. Cl.
USPC .............................................. 257/5; 438/64

(58) Field of Classification Search
USPC ................. 257/5, E31.029, E45.001; 428/64
See application file for complete search history.

(56) References Cited

U.S. PATENT DOCUMENTS 5,254,382 A    10/1993    Ueno et al.
5,883,827 A    3/1999    Morgan
(Continued)

FOREIGN PATENT DOCUMENTS

JP    08-127176 A    5/1996
JP    H11-126366 A    5/1999
(Continued)

OTHER PUBLICATIONS

Stefan Lai et al, "OUM—A 180 nm Nonvolatile Memory Cell Element Technology for Stand Alone and Embedded Applications" IEEE International Electron Devices Meeting, Technical Digest, 2001, pp. 803-806.

(Continued)

*Primary Examiner* — Howard Weiss
*Assistant Examiner* — Steven Rao
(74) *Attorney, Agent, or Firm* — Miles & Stockbridge P.C.

(57) ABSTRACT

On the same semiconductor substrate 1, a memory cell array in which a plurality of memory elements R having a chalcogenide-material storage layer 22 storing a high-resistance state with a high electric resistance value and a low-resistance state with a low electric resistance value by a change of an atom arrangement are disposed in a matrix is formed in a memory cell region mmry, and a semiconductor integrated circuit is formed in a logic circuit region lgc. This chalcogenide-material storage layer 22 is made of a chalcogenide material containing at least either one of Ga or In of 10.5 atom % or larger to 40 atom % or smaller, Ge of 5 atom % or larger to 35 atom % or smaller, Sb of 5 atom % or larger to 25 atom % or smaller, and Te of 40 atom % or larger to 65 atom % or smaller.

20 Claims, 29 Drawing Sheets

(56) References Cited

U.S. PATENT DOCUMENTS

| | | |
|---|---|---|
| 6,858,277 B1 | 2/2005 | Yamada et al. |
| 2001/0048993 A1 | 12/2001 | Nonaka et al. |
| 2004/0233748 A1* | 11/2004 | Terao et al. .................. 365/202 |
| 2005/0119123 A1 | 6/2005 | Yamada et al. |
| 2009/0108247 A1 | 4/2009 | Takaura et al. |
| 2010/0096613 A1 | 4/2010 | Morikawa et al. |

FOREIGN PATENT DOCUMENTS

| | | |
|---|---|---|
| JP | H11-510317 A | 9/1999 |
| JP | 2002-109797 A | 4/2002 |
| JP | 2003-100991 A | 4/2003 |
| JP | 2003-298013 A | 10/2003 |
| JP | 2004-289029 A | 10/2004 |
| JP | 2004-296076 A | 10/2004 |
| JP | 2005-117002 A | 4/2005 |
| JP | 2005-117030 A | 4/2005 |
| JP | 2006-245251 A | 9/2006 |
| TW | 460875 B | 10/2001 |
| WO | WO 00/54982 | 9/2000 |
| WO | WO 2005/029585 A1 | 3/2005 |

OTHER PUBLICATIONS

Toshiyuki Matsunaga et al., "Crystallographic Studies on High-Speed Phase-Change Materials Used for Rewritable Optical Recording Disks" Japanese Journal of Applied Physics, vol. 43, 2004, pp. 4704-4712.

Martijn H. R. Lankhorst et al., "Low-Cost and Nanoscale Non-Volatile Memory Concept for Future Silicon Chips" Nature Materials, vol. 4, 2005, pp. 347-351.

Extended European Search Report dated Oct. 26, 2011, including European Search Opinion, 5 pages.

Office Action from Japanese Patent Application No. 2007-545245 (and English translation).

Office Action from Japanese Patent Application No. 2007-545245 dated Mar. 13, 2012 (and English translation).

Office Action dated Sep. 26, 2012 received in Taiwanese Patent Application No. 095142803 (and English translation).

Office Action dated Jul. 3, 2012, received in Japanese Application No. 2007-545245 (and English translation of Office Action).

* cited by examiner

SEMICONDUCTOR DEVICE

This application is a 371 of PCT Application No. PCT/JP2006/322667 filed Nov. 14, 2006, which claims priority benefit of PCT Application No. PCT/JP2005/021360 filed Nov. 21, 2005.

TECHNICAL FIELD

The present invention relates to a semiconductor device. More particularly, it relates to a technology effectively applied to a semiconductor device provided with a memory element containing a phase-change material.

BACKGROUND ART

Examples of a recording technology using physical properties of a chalcogenide material include a phase-change memory and a phase-change optical disk. As an example of a phase-change material used for the phase-change memory and the phase-change optical disk, a chalcogenide material containing Te (tellurium) has been known. The properties of this chalcogenide material differ depending on its composition. In Japanese Journal of Applied Physics, Vol. 43, 2004, pp. 4704-4712 (Non-Patent Document 2), in view of crystallization mechanisms of phase-change materials used in general, the materials are broadly classified into two types, that is, a crystal nucleation type and a crystal growth type.

In the phase-change optical disk, laser light is irradiated to heat the chalcogenide material, thereby causing a phase change between amorphous and crystalline phases for recording. The reading of recorded information is performed using a difference in reflectivity between an amorphous state and a crystalline state. Japanese Patent Application Laid-Open Publication No. 8-127176 (Patent Document 2) discloses that at least one element X selected from the group including Cr, Ag, Ba, Co, Ni, Pt, Si, Sr, Au, Cd, Cu, Li, Mo, Mn, Zn, Al, Fe, Pb, Na, Cs, Ga, Pd, Bi, Sn, Ti, V, In, and lanthanoid elements is added to a Ge—Sb—Te-based phase-change recording film. Such a specific element X is added for the purpose of, for example, preventing fluidity of the recording film and improving the number of rewritable times.

Also, U.S. Pat. No. 5,254,382 (Patent Document 3) discloses an optical disk medium using a chalcogenide material represented by $\{(Ge_yTe_{1-y})_a(Sb_zTe_{1-z})_{1-a}\}_{1-b}(In_{1-x}Te_x)_b$ (where $0.4 \leq y \leq 0.6$, $0.3 \leq z \leq 0.6$, $0.4 \leq x \leq 0.6$, $0.1 \leq a \leq 0.5$, $0.01 \leq b \leq 0.3$) as a recording layer. In this optical disk medium, In is added to Ge—Sb—Te for the purpose of increasing the stability of an amorphous state to improve the long storability of data, while maintaining the properties of being able to be crystallized at high speed.

On the other hand, U.S. Pat. No. 5,883,827 (Patent Document 1) and IEEE International Electron Devices meeting, TECHNICAL DIGEST, 2001, pp. 803-806 (Non-Patent Document 1) disclose details of a non-volatile memory using a chalcogenide-material film. This non-volatile memory is a phase-change memory in which storage information is written by the change of the atomic arrangement in the phase-change material film in accordance with the Joule heat and cooling rate resulting from the current flowing through the phase-change material film itself. For example, when transformed into an amorphous phase, since a heat higher than 600° C. is applied to the phase-change material film by the Joule heat so as to once melt the phase-change material film, the operation current tends to be increased, and the resistance value changes as much as two to three orders of magnitude depending on the situation.

Of the electric phase-change memories, those using $Ge_2Sb_2Te_5$ have been mainly studied. For example, Japanese Patent Application Laid-Open Publication No. 2002-109797 (Patent Document 4) discloses a recording element using GeSbTe. Also, Japanese Patent Application Laid-Open Publication No. 2003-100991 (Patent Document 5) discloses a technology regarding a memory using a chalcogenide material. Furthermore, Nature Materials, Vol. 4, 2005, pp. 347-351 (Non-Patent Document 3) discloses a technology regarding a phase-change memory using a crystal-growth-type material.

Patent Document 1: U.S. Pat. No. 5,883,827
Patent Document 2: Japanese Patent Application Laid-Open Publication No. 8-127176
Patent Document 3: U.S. Pat. No. 5,254,382
Patent Document 4: Japanese Patent Application Laid-Open Publication No. 2002-109797
Patent Document 5: Japanese Patent Application Laid-Open Publication No. 2003-100991
Non-Patent Document 1: IEEE International Electron Devices meeting, TECHNICAL DIGEST, 2001, pp. 803-806
Non-Patent Document 2: Japanese Journal of Applied Physics, Vol. 43, 2004, pp. 4704-4712
Non-Patent Document 3: Nature Materials, Vol. 4, 2005, pp. 347-351

DISCLOSURE OF THE INVENTION

Problem to be Solved by the Invention

According to the configuration of the memory in FIG. 12 of U.S. Pat. No. 5,883,827 (Patent Document 1), the memory includes a memory cell array, a row decoder XDEC, a bit (column) decoder YDEC, a read circuit RC, and a write circuit WC. In the memory cell array, a memory cell MCpr is disposed at each intersecting point of a word line WLp (p=1, ..., n) and a data line DLr (r=1, ..., m). Each memory cell has a storage element R and a select transistor QM connected in series and interposed between a bit line DL and a ground potential. The word line WL is connected to the gate of the select transistor and a bit select line YSr (r=1, ..., m) is connected to a corresponding bit select switch QAr, respectively. In such a configuration, the select transistor on the word line selected by the row decoder XDEC becomes conductive and the bit select switch corresponding to the bit select line selected by the bit decoder YDEC becomes conductive, whereby a current path is formed in the select memory cell and a read signal is generated on a common bit line I/O. Since the resistance value of the select memory cell differs depending on the stored information, the voltage output to the common bit line I/O differs depending on the stored information. By detecting this difference by the read circuit RC, the stored information of the select memory cell is read.

In the phase-change memory as described above, a phase-change material also used in an optical disk is used as a recording layer, but in the phase-change memory, unlike the optical disk, the resistance to high temperature in a manufacturing process or use environment is required in some cases. However, when a standard phase-change material such as $Ge_2SB_2Te_5$ is used as a recording layer to configure a memory for use at high temperature, there occur two problems.

The first problem is instability of an amorphous state. More specifically, since the amorphous state is a metastable phase, crystallization rapidly proceeds under a high-temperature environment. For example, a microcomputer for automobile control is required to withstand the use under a high-temperature environment of about 140° C. However, when $Ge_2Sb_2Te_5$ is used for a recording layer, the amorphous state is changed to a crystalline state, that is, a low-resistance state within several hours. Thus, the data retaining characteristic is insufficient at such a high temperature, and therefore $Ge_2Sb_2Te_5$ is not suitable for the use under such an environment.

Moreover, in a microcomputer having a memory therein, a memory element is exposed to a high-temperature environment by the chip soldering and crimping in a process of mounting a microcomputer chip. In the case of a microcomputer, a program is recorded in a memory portion and then the memory is mounted in general. In the case of a memory in which data is lost under a high-temperature environment in the mounting process, however, data has to be written after mounting the memory, and therefore a procedure different from the normal procedure has to be taken Since heat load at 250° C. for several minutes is applied in soldering and heat load at 180° C. for several hours is applied in crimping, a data retaining characteristic in a temperature environment higher than the operation temperature has to be ensured though for a short period of time. Therefore, a non-volatile memory for a microcomputer has to be provided with a data retaining characteristic that can withstand the heat load in the manufacturing process described above, and the heat resistance significantly higher than that of the optical disk is required.

The second problem is the resistance value in an amorphous state at high temperature. Since chalcogenide containing Te (tellurium) as a main component is a semiconductor with a narrow band gap, the resistance is exponentially decreased as the temperature is increased. Since the degree of change in an amorphous state is larger than that in a crystalline state, even when a large resistance ratio can be ensured at room temperature, the resistance ratio is decreased when the temperature is increased to 100° C. or higher, and as a result, it becomes impossible to take the read margin. For example, in the case of $Ge_2Sb_2Te_5$, the ratio of a reset resistance to a set resistance at room temperature is approximately 100 to 1. However, when the temperature reaches 100° C. or higher, the reset resistance is significantly decreased, and the resistance ratio is decreased to approximately 30 to 1. Therefore, a large read margin, which is an advantage of the phase-change memory, cannot be taken and the reading method has to be changed depending on the environment temperature in some cases.

As described above, some problems have occurred in a memory using the phase-change material. In particular, since the above-described second problem regarding the resistance value at high temperature is unique to the electrical chalcogenide-material memory, this problem is not considered for the chalcogenide material for optical recording media.

An object of the present invention is to provide a memory element using a chalcogenide material capable of maintaining an excellent data retaining characteristic and an appropriate resistance value even in a high-temperature use environment and manufacturing process.

The above and other objects and novel characteristics of the present invention will be apparent from the description of this specification and the accompanying drawings.

Means for Solving the Problems

The typical ones of the inventions disclosed in this application will be briefly described as follows.

In the present invention, a chalcogenide material containing at least one element selected from the group including gallium (Ga) and indium (In) of 10.5 atom % or larger to 40 atom % or smaller, germanium (Ge) of 5 atom % or larger to 35 atom % or smaller, antimony (Sb) of 5 atom % or larger to 25 atom % or smaller, and tellurium (Te) of 40 atom % or larger to 65 atom % or smaller is used as a recording layer.

Here, the reason why tellurium (Te) of 40 atom % or larger to 65 atom % or smaller is contained is to obtain appropriate rewriting and data retaining characteristics. The reason why germanium (Ge) of 5 atom % or larger to 35 atom % or smaller and antimony (Sb) of 5 atom % or larger to 25 atom % or smaller are contained is to obtain the appropriate number of rewritable times and the appropriate current amount required for rewriting. Furthermore, the reason why at least one element selected from the group including gallium (Ga) and indium (In) of 10.5 atoms or larger to 40 atom % or smaller is contained is to obtain an excellent data retaining characteristic and a high resistance ratio.

Effect of the Invention

The effects obtained by typical aspects of the present invention will be briefly described below.

According to the present invention, a highly-reliable memory element or semiconductor device can be provided.

BRIEF DESCRIPTION OF THE DRAWINGS

FIG. 4 is an explanatory diagram showing the pulse to be applied to the memory element according to the embodiment of the present invention, in which

FIG. 5 is an explanatory diagram schematically showing a crystallization process of a chalcogenide material, in which

BEST MODE FOR CARRYING OUT THE INVENTION

Hereinafter, embodiments of the present invention will be described in detail with reference to the accompanying drawings. Note that components having the same function are denoted by the same reference numbers throughout the drawings for describing the embodiment, and the repetitive description thereof will be omitted. Further, hatching is used in some cases even in a plan view so as to make the present invention easily understood.

First Embodiment

Figure 1:
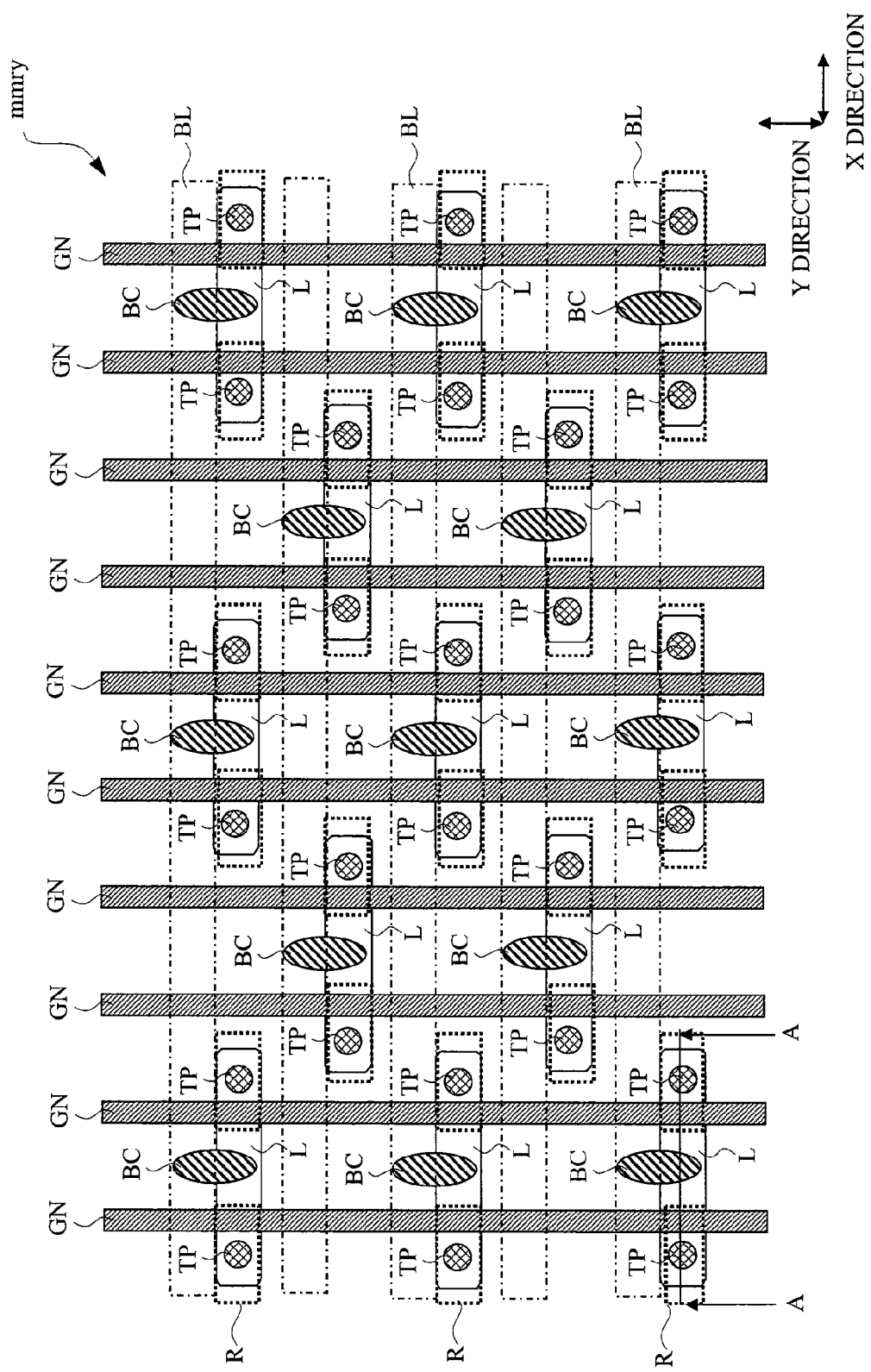
FIG. 1 is a plan view schematically showing the main parts of a semiconductor device provided with a memory element according to an embodiment of the present invention.
Figure 2:
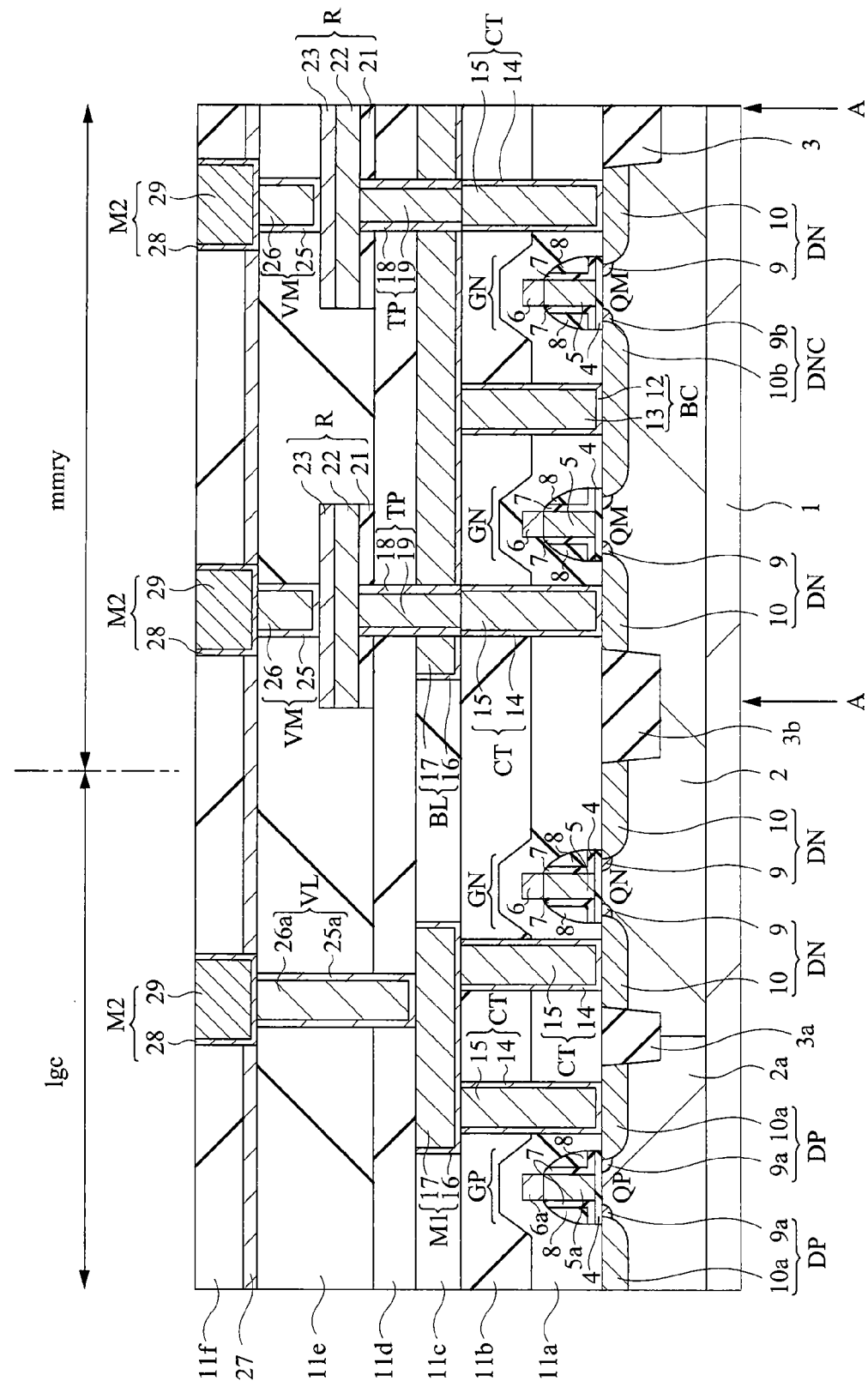
FIG. 2 is a cross-sectional view schematically showing the main parts of the semiconductor device provided with the memory element according to the embodiment of the present invention.

The configuration of a semiconductor device provided with a memory element (non-volatile memory element) according to the first embodiment of the present invention will be described with reference to FIG. 1 and FIG. 2. FIG. 1 is a plan view schematically showing the main parts of the semiconductor device provided with memory elements R according to the first embodiment of the present invention. FIG. 2 is a cross-sectional view schematically showing the main parts of the semiconductor device provided with the memory elements R according to the first embodiment, which shows a cross section taken along the A-A line in FIG. 1. Here, for ease of the description, the parts of the device are shown in a transparent manner. Furthermore, FIG. 2 shows the device so that the relation between a bit line BL and other members can be understood. Therefore, although lower contacts TP seem to penetrate the bit lines BL, the bit lines BL are actually disposed at the back of the contact electrodes TP in the drawing, as is evident from the plan view of FIG. 1.

The semiconductor device according to the first embodiment has a memory cell array, in which a plurality of memory elements R are orderly disposed, in a memory cell region mmry. This memory cell array has a plurality of n channel MIS (Metal Insulator Semiconductor) transistors QM for selecting the plurality of memory elements R, a plurality of word lines (which are also the gates GN of the MIS transistors QM), and a plurality of bit lines BL. One of semiconductor regions DN of the drain and source of each of the MIS transistors QM is electrically connected to the memory element R, and the other semiconductor region DNC is electrically connected to the bit line BL. Also, the gate GN of the MIS transistor QM is used as a word line. More specifically, the gate GN of the MIS transistor QM is electrically connected to the word line. As shown in FIG. 1, at an intersecting point of the bit line BL extending in an X direction and the word line serving as the gate GN of the MIS transistor QM extending in a Y direction, a memory cell including the MIS transistor QM that selects the memory element R and the memory element R is formed. As described above, the memory cells each having the memory element R are disposed at the intersecting points of the bit lines BL extending in the X direction and the word lines extending in the Y direction orderly, that is, in a matrix.

On a p well 2, active regions L of the n channel MIS transistors QM having the gates GN are formed. On each of the active regions L of the n channel MIS transistors QM, the lower contact TP and a bit-line contact BC of the memory cell are formed. The bit-line contact BC is formed so as to be convex in the Y direction of the active region L of the n channel MIS transistor QM.

Also, the bit line BL is disposed so as to be electrically connected to an upper portion of the bit-line contact BC convex in the Y direction of the active region L of the n channel MIS transistor QM.

Further, it is needless to say that the active regions L shown in FIG. 1 are cyclically disposed in the memory cell region mmry. It is also needless to say that the gates GN for use as word lines shown in FIG. 1 are successively parallel to each other in the memory cell region, that is, are disposed in the X direction. Furthermore, it is needless to say that the bit lines BL shown in FIG. 1 are successively parallel to each other in the memory cell region mmry, that is, are disposed in the Y direction.

Still further, as shown in FIG. 2, the semiconductor device provided with the memory elements R according to the embodiment of the present invention has the logic circuit region lgc and the memory cell region mmry, and logics and memories in which memory cell arrays including logic circuits and the memory elements R are respectively formed are mixed in the logic circuit region lgc and the memory cell region mmry. Note that, though not shown, semiconductor integrated circuits and semiconductor elements which form a plurality of logic circuits and sense amplifier circuits of the memory cells are disposed in the logic circuit region lgc.

In this logic circuit region lgc, n channel MIS transistors QN and p channel MIS transistors QP are formed.

The n channel MIS transistor QN has semiconductor regions DN formed to be separated from each other in an upper portion of the p well 2 and having an LDD (Lightly Doped Drain) structure, a gate insulating film 4 formed on a semiconductor substrate 1, and a gate GN formed thereon. Also, the p channel MIS transistor QP has semiconductor regions DP formed to be separated from each other in an upper portion of the n well 2a and having an LDD (Lightly Doped Drain) structure, the gate insulating film 4 formed on the semiconductor substrate 1, and a gate GP formed thereon. The n channel MIS transistor QN and the p channel MIS transistor QP are isolated from each other by an isolation trench 3a formed by burying a shallow trench.

Further, the n channel MIS transistor QM for memory cell selection in the memory cell region mmry has semiconductor regions DN and DNC formed to be separated from each other in an upper portion of the p well 2 and having an LDD (Lightly Doped Drain) structure, the gate insulating film 4 formed on the semiconductor substrate 1 and a gate GN formed thereon. The semiconductor region DNC is shared between the adjacent n channel MIS transistors QM for memory cell selection formed in the same element active region (active region L in FIG. 1).

These n channel MIS transistor QM for memory cell selection, p channel MIS transistor QP, and n channel MIS transistor QN are covered with interlayer insulating films 11a and 11b deposited on the semiconductor substrate 1. These interlayer insulating films 11a and 11b are made of, for example, silicon oxide films and formed by, for example, the known plasma CVD or the like.

This interlayer insulating film 11b has an upper surface planarized so that the memory cell region mmry and the logic circuit region lgc have approximately the same height.

On the semiconductor region DNC of the memory cell region mmry, the bit-line contact BC including a barrier metal 12 and a conductive film 13 made of, for example, tungsten is formed. This bit-line contact BC is electrically connected to the semiconductor region DNC shared between adjacent MIS transistors QM for memory cell selection. Also, on the semiconductor region DN of the memory cell region mmry, a metal contact CT including a barrier metal 14 and a conductive film 15 made of, for example, tungsten is formed. This metal contact CT is electrically connected to the semiconductor region DN of the MIS transistor QM for memory selection.

On the semiconductor region DP of the logic circuit region lgc, a metal contact CT including the barrier metal 14 and the conductive film 15 made of, for example, tungsten is formed. This metal contact CT is electrically connected to the semiconductor region DP of the p channel MIS transistor QP. Also, on the semiconductor region DN of the logic circuit region lgc, a metal contact CT including the barrier metal 14 and the conductive film 15 made of, for example, tungsten is formed. This metal contact CT is electrically connected to the semiconductor region DN of the n channel MIS transistor QN.

An interlayer insulating film 11c is deposited on the interlayer insulating film 11b. This interlayer insulating film 11c is made of, for example, a silicon oxide film and is formed by, for example, the known plasma CVD. In this interlayer insulating film 11c, a bit line BL of the memory cell region mmry and a first layer wiring M1 of the logic circuit region lgc are formed.

The bit line BL of the memory cell region mmry is formed by depositing a barrier metal 16 formed of, for example, a titanium film and a titanium nitride film and a conductive film 17 made of, for example, tungsten in this order from below. This bit line BL is electrically connected to the bit-line contact BC and is further electrically connected to the semiconductor region DNC of the n channel MIS transistor QM for memory cell selection through the bit-line contact BC.

Also, the first-layer wiring M1 of the logic circuit region lgc is formed by depositing the barrier metal 16 formed of, for example, a titanium film and a titanium nitride film and the conductive film 17 made of, for example, tungsten in this order from below. This first-layer wiring M1 is electrically connected to the metal contact CT and is further electrically connected to the semiconductor region DP of the p channel MIS transistor QP and the semiconductor region DN of the n channel MIS transistor QN through the metal contact CT.

An interlayer insulating film 11d is deposited on an upper surface of the interlayer insulating film 11c. This interlayer insulating film 11d is made of, for example, silicon oxide. This interlayer insulating film 11d has an upper surface planarized so that the memory cell region mmry and the logic circuit region lgc have approximately the same height.

In the interlayer insulating films 11c and 11d in the memory cell region mmry, a connection hole through which the upper surface of the metal contact CT is exposed is formed (opened). In this connection hole, a spacer insulating film 18 made of, for example, silicon nitride or silicon oxide and a conductive film 19 made of, for example, tungsten are buried.

A lower contact (lower electrode) TP of the memory cell is electrically connected to the metal contact CT and is further electrically connected therethrough to the semiconductor region DN of the MIS transistor QM for memory cell selection. More specifically, the lower contact TP and the metal contact CT of the memory cell form a two-stage plug electrode.

An interlayer insulating film 11e is deposited on an upper surface of the interlayer insulating film 11d. This interlayer insulating film 11e is made of, for example, silicon oxide. In the interlayer insulating film 11e of the memory cell region, the memory element R, which also serves as a variable resistor that is changed between a high-resistance state and a low-resistance state, is formed.

The memory element R is formed in a plate shape, and is formed of a peeling prevention film 21 made of, for example, silicon nitride, a chalcogenide-material storage layer 22 made of a chalcogenide material (phase-change material) covering the surface of the peeling prevention film 21, and an upper plate (upper electrode) 23 made of, for example, tungsten covering the surface of the chalcogenide-material storage layer 22. The chalcogenide-material storage layer 22 forming the memory element R is made of a chalcogenide material containing at least either one of indium (In) or gallium (Ga), germanium (Ge), antimony (Sb), and tellurium (Te) at an appropriate composition ratio.

The peeling prevention film 21 formed of an insulating film made of, for example silicon nitride is provided on a lower side surface of this chalcogenide-material storage layer 22, and a part of the peeling prevention film 21 is removed to form the lower contact (lower electrode) TP. More specifically, the lower portion of the memory element R is electrically connected to the lower contact TP and is further electrically connected therethrough to the semiconductor region DN of the n channel MIS transistor QM for memory cell selection.

In the interlayer insulating film 11e in the memory cell region mmry, a connection hole through which the upper surface of the upper plate 23 is exposed is formed (opened). In this connection hole, a barrier metal 25 formed of, for example, a titanium film and a titanium nitride film is buried and further a metal film formed of a conductive film 26 is buried, thereby forming a memory cell via VM.

In the interlayer insulating films 11d and 11e in the logic circuit region lgc, a connection hole through which the upper surface of the first-layer wiring M1 is exposed is formed (opened). In this connection hole, a barrier metal 25a formed of, for example, a titanium film and a titanium nitride film is buried and further a conductive film 26a made of, for example, tungsten is buried, thereby forming a via VL. The interlayer insulating film 11e has an upper surface planarized so that the memory cell region mmry and the logic circuit region lgc have approximately the same height.

An interlayer insulating film 11f is deposited on the upper surface of the interlayer insulating film 11e. This interlayer insulating film 11f is made of, for example, silicon oxide. In the interlayer insulating film 11f, a second-layer wiring M2 is formed. In the interlayer insulating film 11f, a connection trench through which the upper surface of the via VL is exposed is formed (opened). In this connection trench, a barrier metal 28 formed of, for example, a titanium film and a titanium nitride film is buried and further a metal film formed of a conductive film 29 is buried, thereby forming the second-layer wiring M2.

Figure 3:
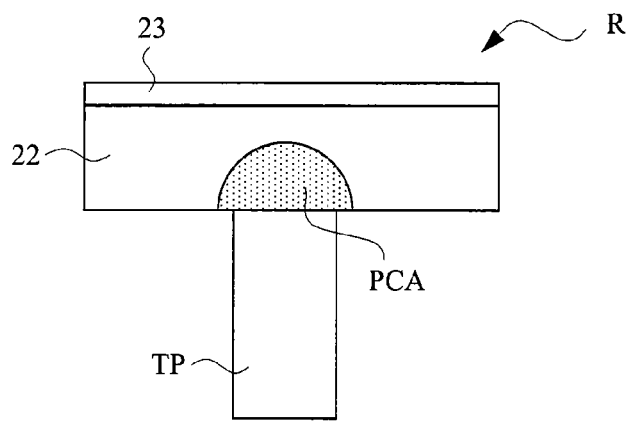
FIG. 3 is an explanatory diagram schematically showing the memory element according to the embodiment of the present invention.
Figure 4A:
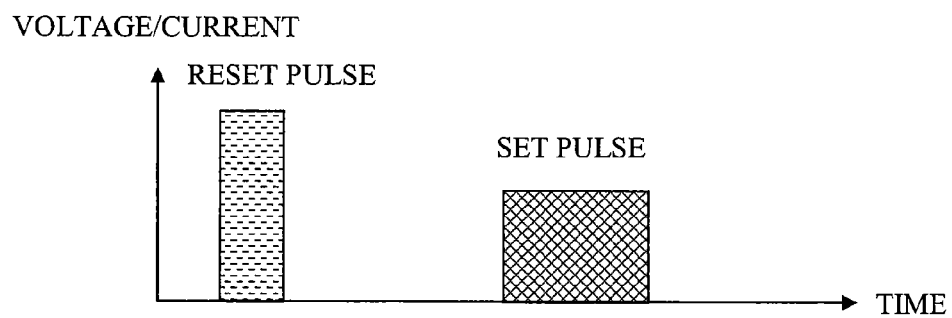
FIG. 4A shows a shape of the pulse to be applied and FIG. 4B shows a temperature change of a storage layer by the applied pulse.
Figure 4B:
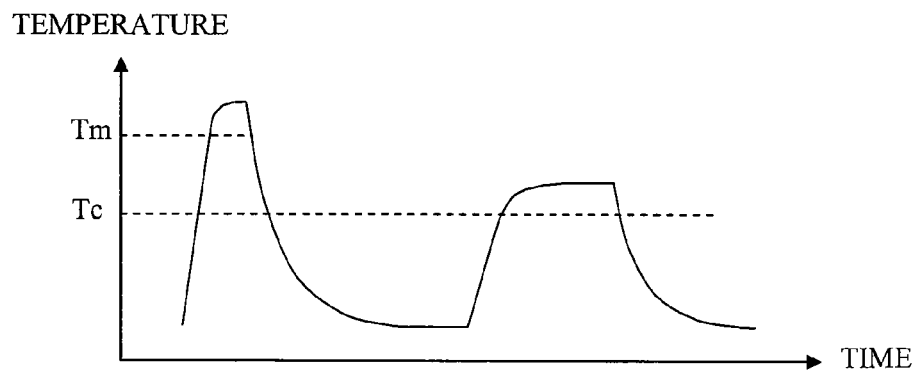

Next, the recording principle of the memory element R according to the first embodiment of the present invention will be described in detail with reference to FIG. 3 and FIG. 4. FIG. 3 is an explanatory diagram schematically showing the memory element R according to the first embodiment of the present invention. FIG. 4 is an explanatory diagram showing the pulses to be applied to the memory element R according to the first embodiment of the present invention, in which FIG. 4A shows the shape of the pulses to be applied and FIG. 4B shows the temperature changes of the storage layer by the applied pulses.

As shown in FIG. 3, the memory element R has the chalcogenide-material storage layer 22 that stores information by changing the atomic arrangement and the lower electrode TP and the upper electrode 23 formed on the both surfaces of the storage layer. Also, the chalcogenide-material storage layer 22 is a storage layer that stores a high-resistance state with a high electric resistance value and a low-resistance state with a low electric resistance value by means of the change of the atomic arrangement like the phase change between a crystalline phase and an amorphous phase. Further, the lower electrode TP and the upper electrode 23 are formed of a conductive film made of a conductive material.

The chalcogenide material is heated by Joule heat generated by applying (conducting) a reset pulse corresponding to the high-resistance state which is the recording state or a set pulse corresponding to the low-resistance state to the chalcogenide-material storage layer 22 through the lower electrode TP, thereby performing the recording to the chalcogenide-material storage layer 22 in which the atomic arrangement is changed. Note that, as shown in FIG. 4A, the set pulse (second pulse) is a pulse generally with a longer time and a lower voltage or current than those of the reset pulse (first pulse).

Here, a pulse is applied from the lower electrode TP to the chalcogenide-material storage layer 22, and the change of the atomic arrangement occurs from a lower side of the chalcogenide-material storage layer 22 close to the lower electrode TP, in which the heat is easily generated. In the present application, this region is referred to as a phase-change region PCA.

When a reset pulse is applied to achieve a high-resistance state, the chalcogenide material is heated by Joule heat to a melting point Tm or higher to be in a molten state. After the pulse is interrupted, the molten chalcogenide material is rapidly cooled. As shown by the temperature change of the chalcogenide material at this time, if the cooling rate after the pulse is interrupted is sufficiently high, the random atomic arrangement in a liquid state is frozen and the phase-change region PCA becomes an amorphous state. In this amorphous state, the chalcogenide-material storage layer 22 is at a high resistance, and therefore the memory element R is in a high-resistance state (reset resistance).

On the other hand, when a set pulse is applied to achieve a low-resistance state and the chalcogenide material is heated by Joule heat and maintained at a crystallization temperature Tc or higher for a predetermined period of time, the phase-change region PCA in the amorphous state is changed to a crystalline state. In this crystalline state, the chalcogenide-material storage layer 22 has a lower resistance compared with that in the amorphous state, and therefore the memory element R becomes a low-resistance state (set resistance). However, in the case where multicomponent crystals are minute and have different compositions from each other, a large disturbance of the atomic arrangement occurs at their interface, and the resistance value in the crystalline state is relatively higher than that in the amorphous state in some cases. By supplying a current (by applying a pulse) to the memory element R to change the atomic arrangement of the chalcogenide material in this manner, information can be recorded. In the reading of the recorded information, a voltage or current at a level lower than that of the set pulse or reset pulse is applied so as not to change the state of the chalcogenide material, thereby reading the resistance value of the memory element R. The resistance at the time of reset (high-resistance state) is higher than that at the time of set (low-resistance state), and the ratio thereof is, for example, 10 to 1 to 1000 to 1 or more. Therefore, the memory element R according to the first embodiment has an advantage of a large read signal and an easy sense operation.

Next, the mechanism of the occurrence of a phase change in the chalcogenide material will be described with reference to FIG. 5. FIG. 5 is an explanatory diagram schematically showing the crystallization process of the chalcogenide material, in which FIG. 5A shows a crystal nucleation type and FIG. 5B shows a crystal growth type.

Figure 5A:
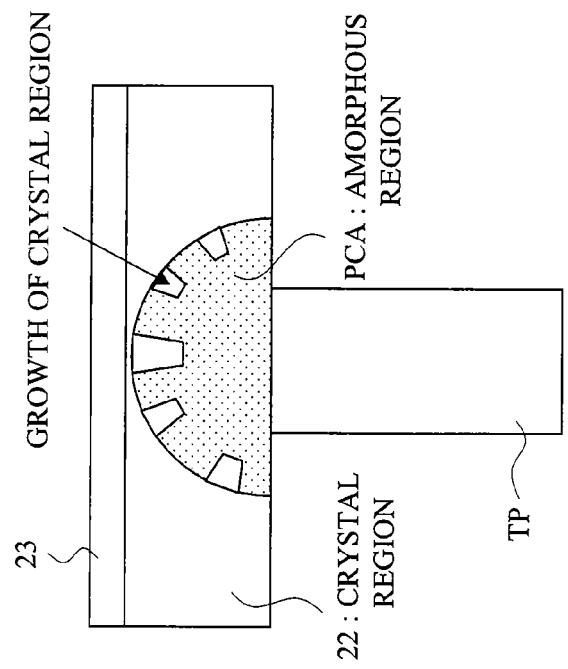
FIG. 5A shows a crystal nucleation type and FIG. 5B shows a crystal growth type.
Figure 5B:
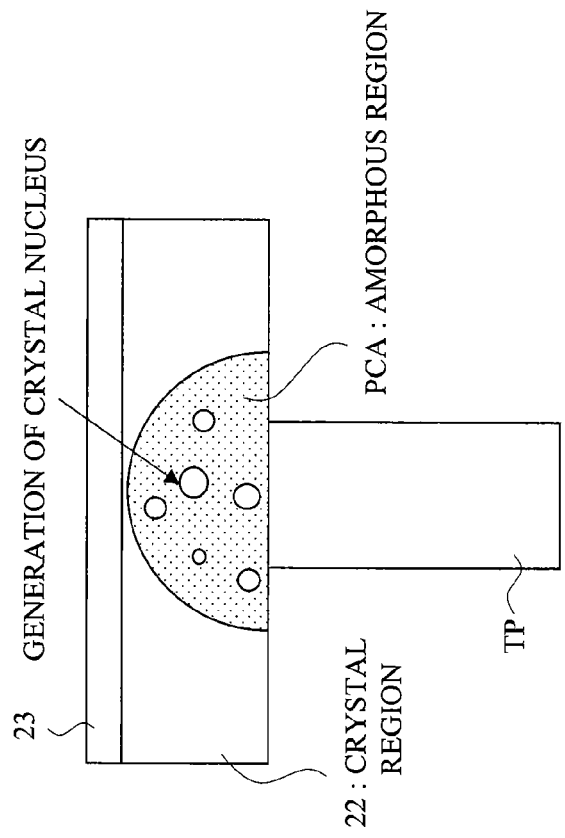

The crystal nucleation type shown in FIG. 5A is a type of a material in which many crystal nuclei are generated though the growing rate thereof is slow and many crystal grains are generated therefrom. Typical examples of the crystal-nucleation-type material include $Ge_2Sb_2Te_5$ based on a pseudo-binary-system composition of $GeTe$—$Sb_2Te_3$. On the other hand, the crystal growth type shown in FIG. 5B is a type in which new crystal nuclei are hardly generated and crystallization proceeds as crystal grains are extended from the crystal region near the amorphous region because of the high crystal growing rate. The materials belonging to this crystal growth type are based on a $Sb_{70}Te_{30}$ eutectic material and include Ag—In—Sb—Te, for example. Although both the crystal nucleation type and the crystal growth type include Sb (antimony) and Te (tellurium), the former contains Te as a main component and the latter contains Sb as a main component, and by this difference in composition, the crystallization mechanism significantly differs therebetween. In the phase-change optical disk, the crystal growth type with a high crystallization rate is often used. In the crystal growth type, however, due to this high crystallization rate, the element in an amorphous state is rapidly crystallized when it is placed in a high-temperature atmosphere. In the field of a semiconductor memory, it is necessary to consider the usage at high temperature. Therefore, in the first embodiment, the crystal nucleation type, that is, the composition containing Te more than Sb is adopted to improve the retention at high temperature.

In the phase-change memory and the phase-change optical disk, the characteristics as a memory are determined by the physical properties of the phase-change material. Therefore, many inventions for improving the material physical properties have been disclosed so far. Ag—In—Sb—Te as exemplified above has been widely used as a phase-change recording material for an optical disk. This material is of a crystal growth type based on an $Sb_{70}Te_{30}$ eutectic alloy, and is obtained by adding Ag or In in order to improve the optical characteristics.

Figure 6:
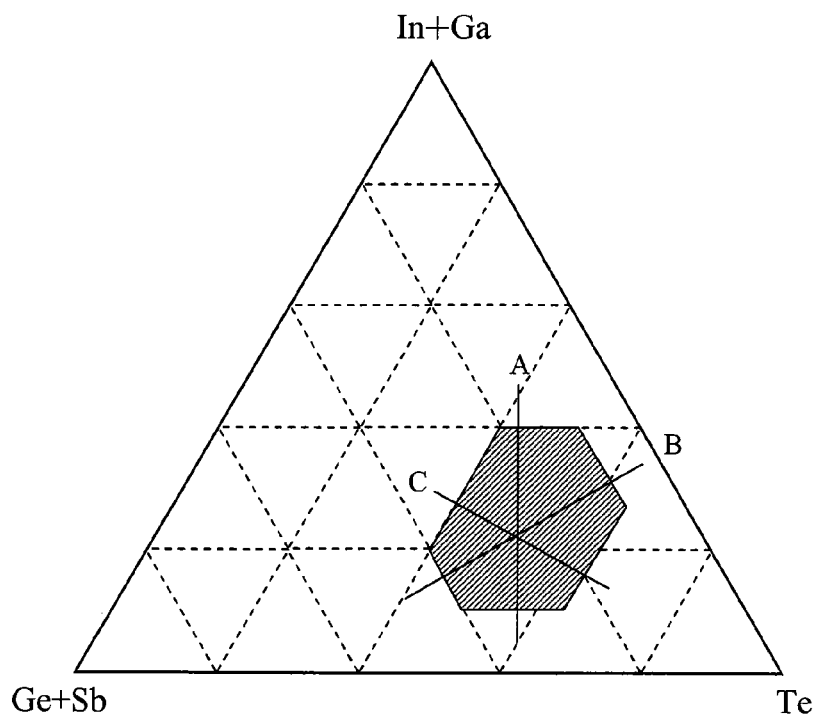
FIG. 6 is an explanatory diagram showing an example of a composition range of the chalcogenide material according to the first embodiment.
Figure 7:
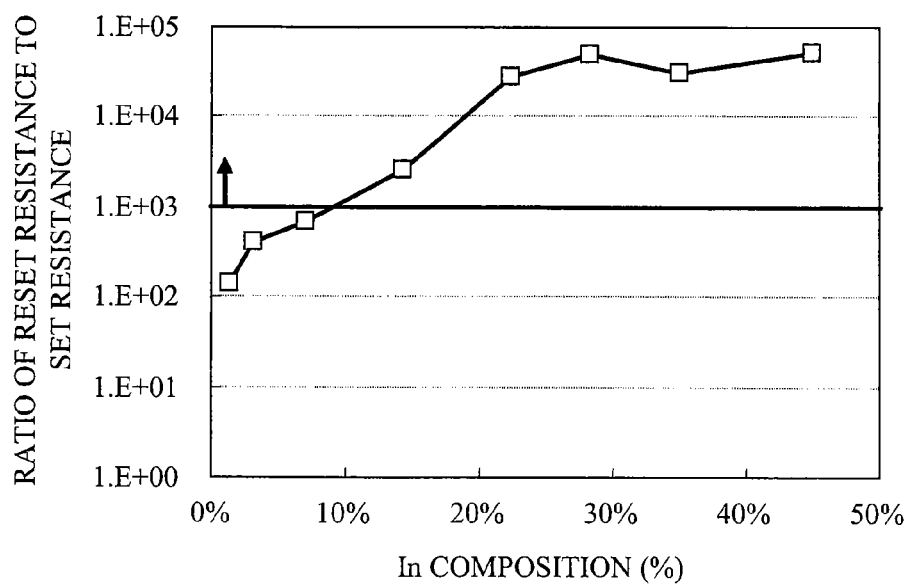
FIG. 7 is an explanatory diagram showing composition dependency of a ratio of a reset resistance to a set resistance of the memory element according to the first embodiment.
Figure 8:
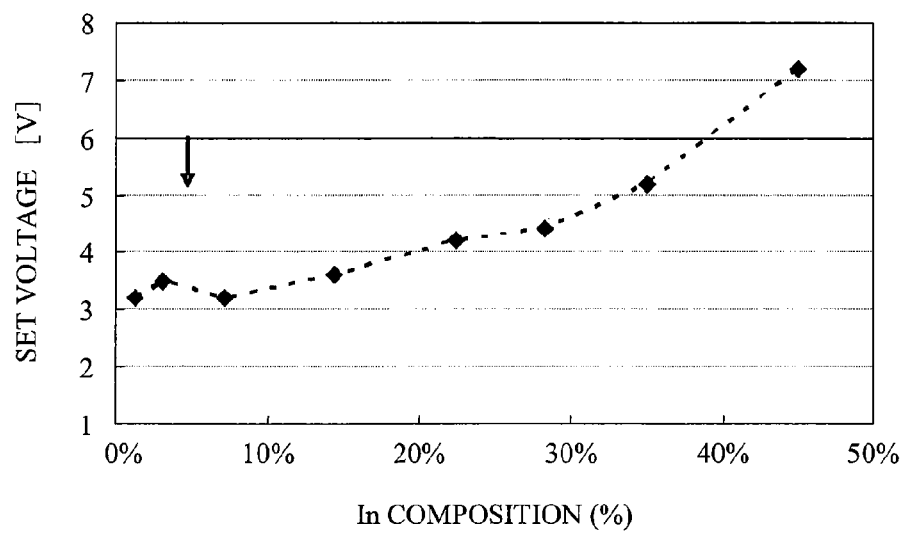
FIG. 8 is an explanatory diagram showing composition dependency of the set voltage of the memory element according to the first embodiment.
Figure 9:
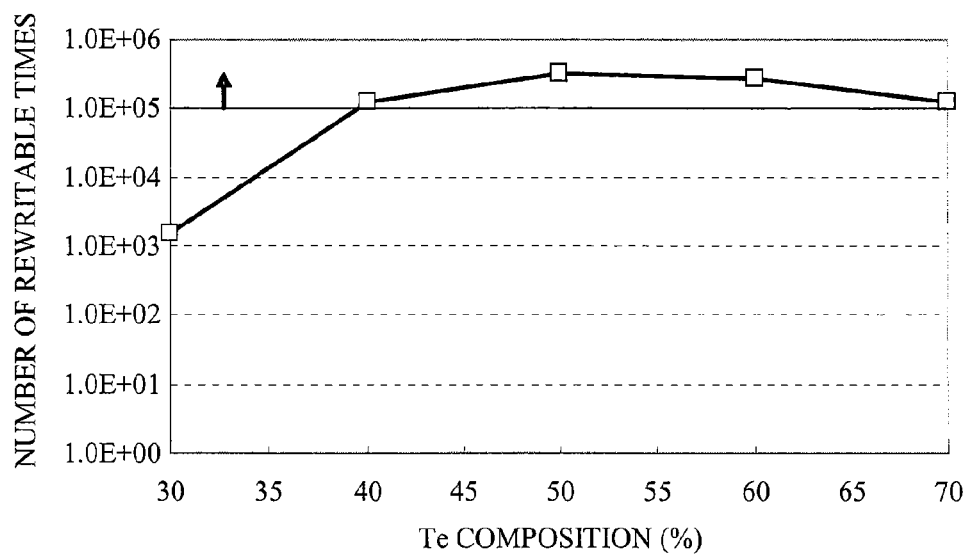
FIG. 9 is an explanatory diagram showing composition dependency of the number of rewritable times of the memory element according to the first embodiment.
Figure 10:
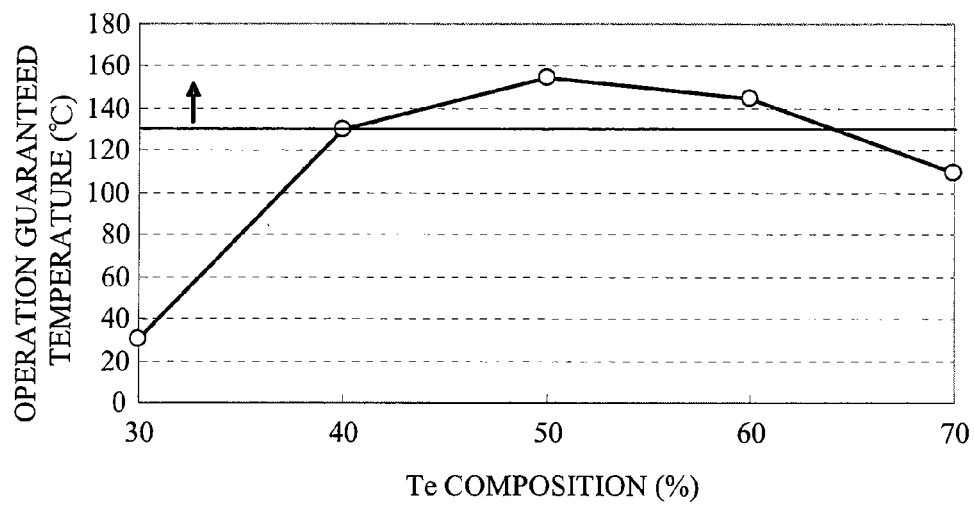
FIG. 10 is an explanatory diagram showing composition dependency of an operation guaranteed temperature of the memory element according to the first embodiment.
Figure 11:
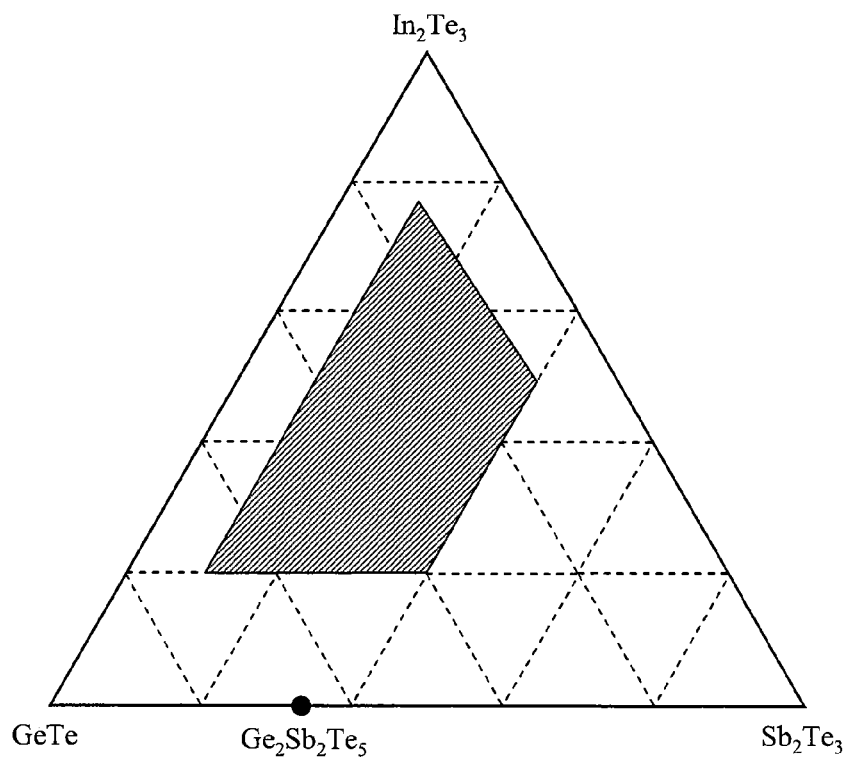
FIG. 11 is an explanatory diagram showing another example of a composition range of the chalcogenide material according to the first embodiment.

Next, the relation between various conditions of the material and fabrication and memory characteristics regarding the memory element according to the first embodiment will be described with reference to FIG. 6 to FIG. 11. FIG. 6 is an explanatory diagram showing an example of a composition range of the chalcogenide material according to the first embodiment. FIG. 7 is an explanatory diagram showing composition dependency of a ratio of the reset resistance to the set resistance of the memory element according to the first embodiment. FIG. 8 is an explanatory diagram showing composition dependency of the set voltage of the memory element according to the first embodiment. FIG. 9 is an explanatory diagram showing composition dependency of the number of rewritable times of the memory element according to the first embodiment. FIG. 10 is an explanatory diagram showing composition dependency of an operation guaranteed temperature of the memory element according to the first embodiment. FIG. 11 is an explanatory diagram showing another example of the composition range of the chalcogenide material according to the first embodiment. Note that the composition dependencies in FIG. 7 to FIG. 9 are those at room temperature.

The recording layer forming the memory element R according to the first embodiment is made of a phase-change material (chalcogenide material) containing, for example, at least either one of indium (In) or gallium (Ga), germanium (Ge), antimony (Sb), and tellurium (Te) at an appropriate composition ratio. When memory elements have been fabricated using chalcogenides of various compositions as the recording-layer materials according to the first embodiment, composition dependencies of the characteristics are as those described below, and a range hatched in FIG. 6 has been obtained as a desirable composition.

The composition dependency when the content of In is changed, for example, on a straight line A in FIG. 6 will be described. As shown in FIG. 7, the ratio of the reset resistance to the set resistance is increased as the amount of In is increased. This is because an increase effect of the set resistance is hardly observed while the reset resistance increases. In particular, when the composition of In reaches 10.5 atom % or larger, the ratio of the reset resistance to the set resistance at room temperature exceeds 1000 to 1. If In is not contained, the resistance ratio is approximately 100 to 1. However, if In is added to control the ratio of the reset resistance at room temperature to 1000 to 1 or more, even when the value of the reset resistance is significantly decreased under a high-temperature use environment of 130° C. or higher, a large resistance ratio of 100 to 1 or more can be maintained. Note that the electric resistance value in a high-resistance state is 5 MΩ or higher at room temperature and is 500 kΩ or higher at 130° C.

Meanwhile, if the In composition is increased to 40 atom %, as shown in FIG. 8, the set voltage required for a set operation is abruptly increased to pose a problem for its use.

As described above, when the concentration of In is 10.5 atom % or lower, the value of the reset resistance is not increased and also the data retaining characteristic is insufficient. Therefore, an effect of improving the operation reliability at high temperature, which is an object of the present invention, cannot be achieved. On the other hand, when the concentration of In is higher than 40 atom %, it becomes difficult to achieve the low resistance, and the time and amount of current required for a set operation are increased. Therefore, such a concentration of In is not suitable for use.

The composition dependency when the contents of Ge and Sb are changed, for example, on a straight line B in FIG. 6 will be described. When the total amount of Ge and Sb is smaller than 10 atom %, the heat resistance in a manufacturing process is significantly decreased and the chalcogenide material is sublimated in the manufacturing process, and as a result, it is impossible to complete the process. If the amount of Ge and Sb is small, since In—Te bonding with strong iconicity is increased, Te tends to be sublimated. However, if Ge and Sb are present, since Ge—Te and Sb—Te bondings with strong covalent bond are formed, the sublimation of Te is suppressed. On the other hand, if the total amount of Ge and Sb is larger than 40 atom %, there occur problems that the number of rewritable times is decreased and the amount of current required for a reset operation is increased. In particular, there occurs a problem that the number of rewritable times is decreased when the content of Ge is large, and there occurs a problem that the amount of current required for a reset operation is increased when the content of Sb is large. Further, if the total amount exceeds 40 atom % even when the content of Ge and the content of Sb are approximately the same, the ratio of the reset resistance to the set resistance is disadvantageously decreased. Still further, if the content of Sb is increased, there occurs a problem that a retention characteristic at high temperatures is deteriorated. Therefore, although retention is improved by adding In even when the content of Ge and the content of Sb are approximately the same, the retention characteristic can be further improved by setting the content of Sb to be relatively smaller than the content of Ge.

The composition dependency when the content of Te is changed, for example, on a straight line C in FIG. 6 will be described. Note that FIG. 9 and FIG. 10 show the results obtained when the content of Ge and the content of Sb are adjusted to be equal to each other. As shown in FIG. 9, when Te is 40 atom % or smaller, the reset operation cannot be performed after rewriting hundred thousand times or less. On the other hand, as shown in FIG. 10, when Te is 65 atom % or larger, the operation guaranteed temperature is 130° C. or lower, and the requirement cannot be satisfied.

As described above, if the content of Te is small, phase separation proceeds in accordance with the increase of the number of rewritings, and the reset operation cannot be performed. Meanwhile, if the content of Te is too large, stability in a high-resistance state is insufficient, and sufficient data retaining characteristics cannot be achieved.

As described above, according to the detailed studies of composition dependency of the operation guaranteed temperature and rewrite characteristics, the conclusion has been obtained that the range hatched in FIG. 6 is desirable. More specifically, in the chalcogenide material (phase-change material) according to the first embodiment, at least either one of indium or gallium is 10.5 atom % or larger to 40 atom % or smaller, germanium is 5 atom % or larger to 35 atom % or smaller, antimony is 5 atom % or larger to 25 atom % or smaller, and tellurium is 40 atom % or larger to 65 atom % or smaller. Note that these atom percentages can be measured by using well-known technologies such as TEM and EDX. In this manner, in the first embodiment, it is possible to provide a memory element using chalcogenide with an excellent data retaining characteristic and an appropriate resistance value even in the high-temperature use environment and manufacturing process.

Also, although FIG. 6 shows the total amount of two elements of Ge and Sb, since these elements do not bring the similar action, it is possible to adjust these elements so that they are contained within appropriate ranges. For example, if the total amount of composition of Ge and Sb is constant in the overall constituent elements, when the ratio of Ge is high, the change in volume due to the phase change is large, and the exfoliation occurs at an interface between an electrode and a phase-change region by a large number of rewritings, and therefore, the number of rewritable times is restricted. On the other hand, when the ratio of Sb is high, there occur the problems that the current required for rewriting is increased, the reset resistance is decreased, and the data retaining characteristics are deteriorated due to the instable amorphous state. A more desirable composition range obtained in view of these points is shown in FIG. 11.

FIG. 11 shows an optimum composition in the case where the compositions of each vertex are set to GeTe, $Sb_2Te_3$, and $In_2Te_3$. As a matter of course, a part of each element can be replaced by an element of the same homology in the periodic table. For example, a part of In can be replaced by Ga or a part of Te can be replaced by Se. Note that, since In has a higher sublimation temperature and higher applicability to a semiconductor manufacturing process than those of Ga, it is more preferable to use In rather than Ga (or use more In). The composition range in FIG. 11 is a preferable range for the composition of Ge, Sb, and In when the concentration of Te is about 50 to 60 atom %. It shows that GeTe is preferably 12 mol % or larger, $Sb_2Te_3$ is preferably 11 mol % or larger to 40 mol % or smaller, and $In_2Te_3$ is preferably 20 mol % or larger. Since the skeleton of the NaCl structure is formed of Te with a large atomic diameter, if Te concentration is near this composition, the precipitation of other components and the phase separation hardly occur even if the rewriting is performed many times, and the high reliability can be achieved.

In the composition range shown in FIG. 11, if the concentration of GeTe is increased, exfoliation occurs at an interface between the chalcogenide material and the electrode due to the rewriting performed many times, and the number of rewritings is restricted to hundred thousand times or less. Therefore, such a concentration of GeTe is not appropriate. If the concentration of $Sb_2Te_3$ is increased, there occur the problems that the reset resistance is decreased, the amount of current required for a reset operation is increased, and the data retaining characteristic is deteriorated. Further, if the concentration of $Sb_2Te_3$ is increased, there occurs the problem that the amount of current required for a set operation is increased. Furthermore, if the concentration of $In_2Te_3$ is decreased, since the resistance ratio is as small as 1000 to 1 or less, the effects to be achieved in the present invention cannot be attained, and if the concentration of $In_2Te_3$ is increased, the time and amount of current required for a set operation are increased. In view of these points, the region hatched in FIG. 11 is obtained as a desirable range.

The first embodiment shows the chalcogenide material made of at least either one of Ga or In, Ge, Sb, and Te. Alternatively, a part of these elements can be replaced by another element. For example, a part of Te can be replaced by Se (selenium). Se brings the effects of improving the data retaining characteristic, long-time resistance to a soldering process, and preventing oxidation during the manufacturing process. On the other hand, when the content of Se exceeds approximately one-fifth of Te, the time required for a set operation is increased to 5 μs or longer. Therefore, within a range in which the above-described problems do not arise, an appropriate content has to be selected for use in accordance with the purpose.

Also, for the purpose of increasing the speed of a set operation, all or part of Ge may be replaced by at least one element of Sn and Pb and all or part of Sb may be replaced by Bi. By these elements, the increase in speed of a set operation can be achieved while maintaining a soldering reflow resistance in a reset state, and therefore they do not interfere with the effects of the present invention. However, the retaining life of the reset state is slightly shortened. Other than the above, H, B, C, O, Si, P, S, As, Au, Ag, Cu, Ti, Zr, Hf, V, Nb, Ta, Cr, Mn, Fe, Co, Ni, Rh, or Pd of 10 atom % or smaller may be contained. By the addition of these elements, the improvement in the number of rewritable times can be expected.

Next, the semiconductor device according to the first embodiment will be described in detail along with the manufacturing process thereof with reference to FIG. 12 to FIG. 25 and FIG. 31 to FIG. 34. FIG. 12 to FIG. 25 and FIG. 31 to FIG. 34 are cross-sectional views schematically showing the semiconductor device during the manufacturing process thereof according to the first embodiment of the present invention. Note that, as shown in FIG. 25, for example, for clearly describing the relation between the bit line BL and other members, the lower contacts TP are shown to penetrate the bit line BL, but the bit lines BL are actually disposed at the back of the contact electrodes TP in the drawing, as is evident from the plan view of FIG. 1.

Figure 12:
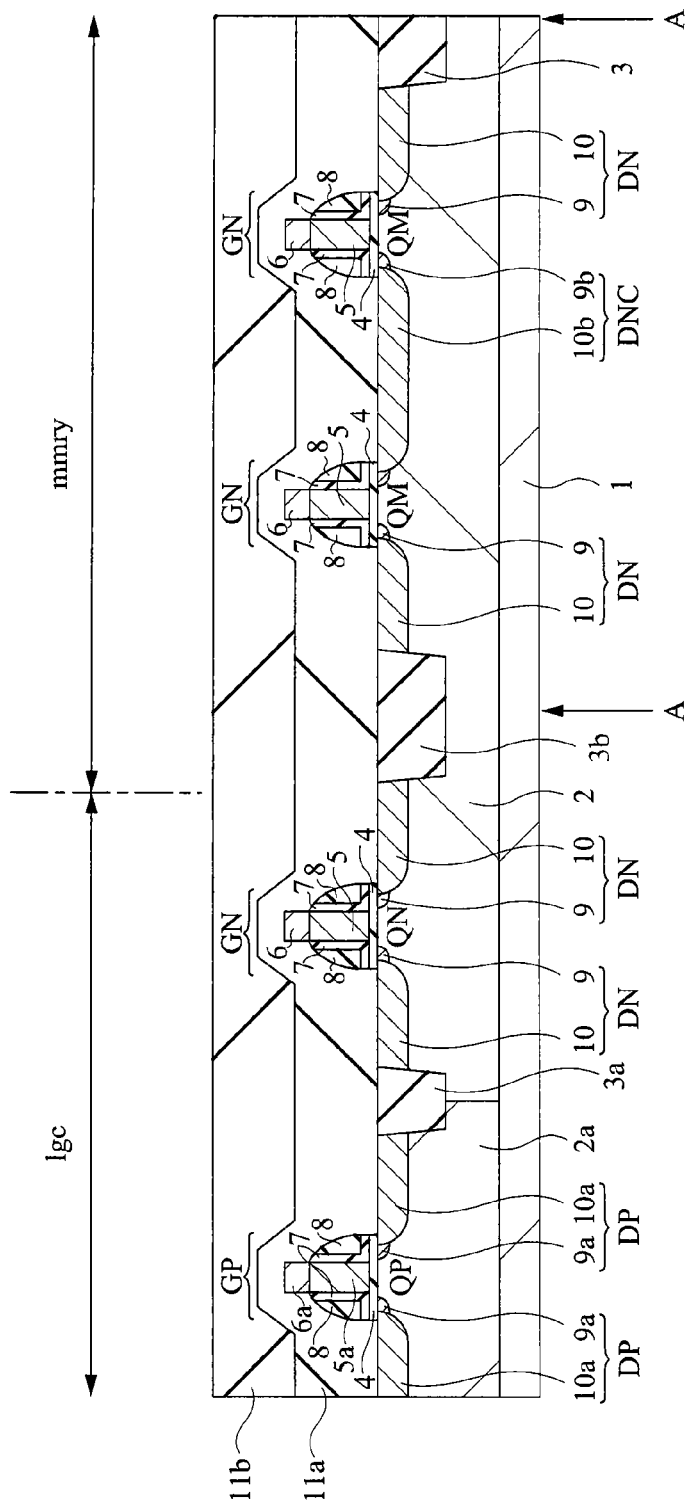
FIG. 12 is a cross-sectional view schematically showing a semiconductor device during a manufacturing process according to the embodiment of the present invention.

First, as shown in FIG. 12, by using a known method, the n channel MIS transistor QN and the p channel MIS transistor QP are formed in the logic circuit region lgc, and the n channel MIS transistors QM for memory selection are formed in the memory cell region mmry. The method of forming these MIS transistors QN, QP, and QM will be briefly described below.

In the semiconductor substrate 1 made of single crystal silicon with a p conductivity type in the memory cell region mmry, the p well 2 is formed by using a known method. Also, in the semiconductor substrate 1 in the logic circuit region lgc, the n well 2a is formed by using a known method. In an upper layer portion of this semiconductor substrate 1, the isolation trenches 3, 3a, and 3b formed by burying shallow trenches are formed by using a known method. These isolation trenches 3, 3a, and 3b are formed of an insulating film such as silicon oxide. The regions sectioned by these isolation trenches 3, 3a, and 3b are so-called active regions, and elements and others are formed on a part of these regions. The gate insulating film 4 on the semiconductor substrate 1 is made of silicon oxynitride, for example, and the thickness thereof is set to, for example, about 1.5 to 10 nm.

Next, a conductive film 5 made of n type polysilicon and a conductive film 5a made of p type polysilicon are formed by using a known method. Next, LLD active regions 9 of the n channel MIS transistors QN and QM and LLD active regions 9a of the p channel MIS transistor QP are formed by using a known method. Then, sidewall spacers 7 made of, for example, silicon oxide, and sidewall spacers 8 formed of, for example, silicon nitride films are formed by using a known method. Subsequently, active regions 10 of the n channel MIS transistors, active regions 10a of the p channel MIS transistors, salicide films 6 made of, for example, n type polysilicon, and salicide films 6a made of, for example, p type polysilicon are formed by using a known method. Next, the interlayer insulating films 11a and 11b are formed by using a known method. The interlayer insulating film 11b has an upper surface planarized so that the memory cell region and the logic circuit region have approximately the same height.

In this manner, the MIS transistors QN, QP, and QM are formed. These MIS transistors QN, QP, and QM have the gates GN and GP with the salicide gate electrode structure and the semiconductor regions DN, DNC, and DP to be source and drain.

Figure 13:
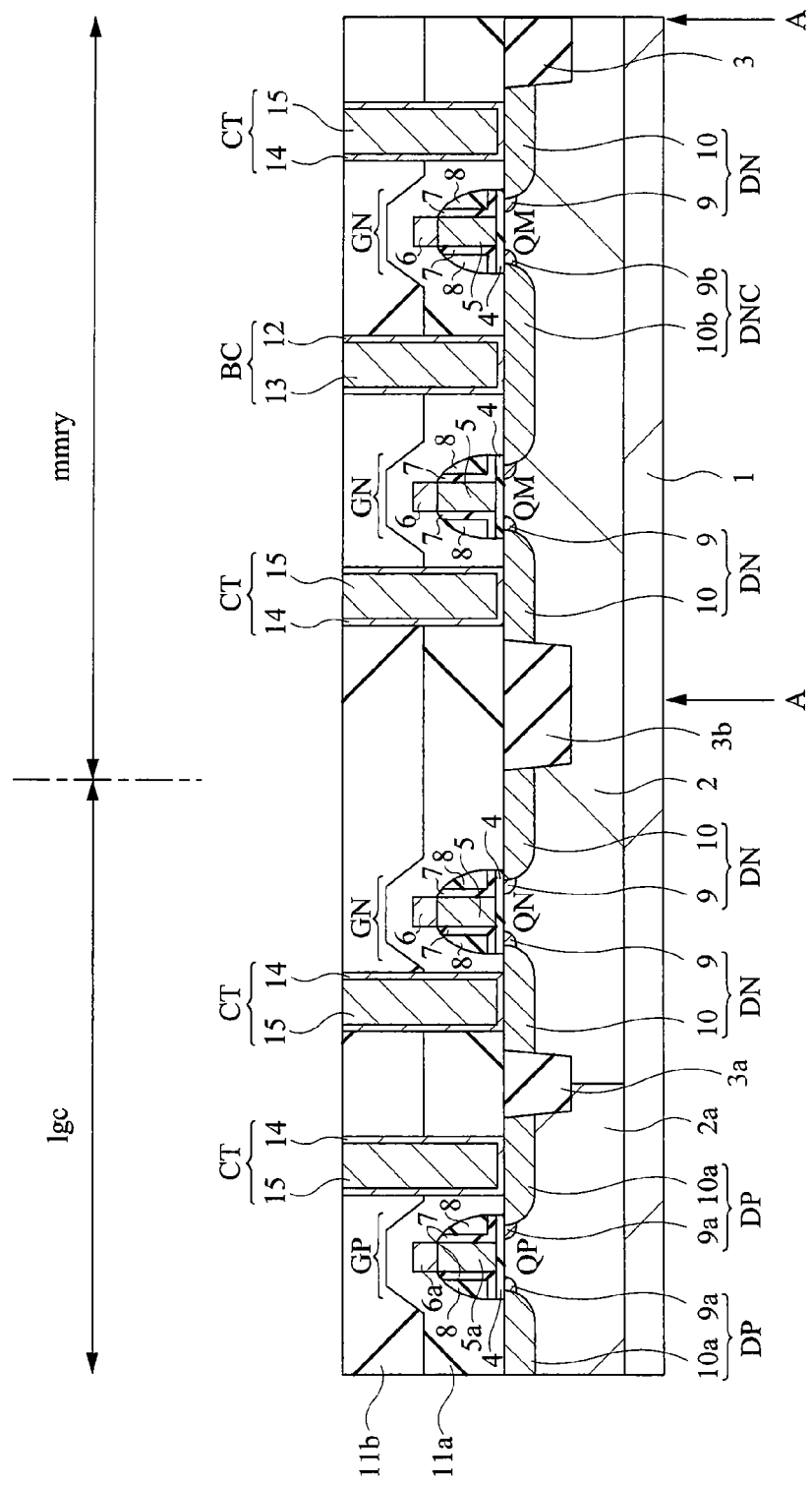
FIG. 13 is a cross-sectional view schematically showing the semiconductor device during the manufacturing process continued from FIG. 12.

Then, as shown in FIG. 13, a photoresist (not shown) for forming the connection hole of the logic circuit, the connection hole in the memory cell region, and a bit-line hole in the memory cell region is formed on the interlayer insulating film 11b. With using the photoresist as an etching mask, the connection holes are formed (opened) in the interlayer insulating films 11a and 11b so as to expose the upper surfaces of the semiconductor region DN of the n channel MIS transistor QN, the semiconductor region DP of the p channel MIS transistor QP, the semiconductor regions QN and DNC of the n channel MIS transistor QM for memory cell selection.

Next, after the photoresist is removed, the barrier metal 14 made of, for example, titanium and titanium nitride is deposited by sputtering in this order from the lower layer on the semiconductor regions DN, DP, and DNC. On the deposited film, for example, the conductive film 15 is stacked by CVD to bury the connection holes, thereby forming the metal contacts CT and the bit-line contact BC. Then, the barrier film 14 and the conductive film 15 are etched back by using the known CMP until the upper portion of the interlayer insulating film 11b is exposed and the metal contacts CT and the bit-line contact BC in the connection holes have the same height, thereby completely isolating the metal contacts CT and the bit-line contact BC.

Figure 14:
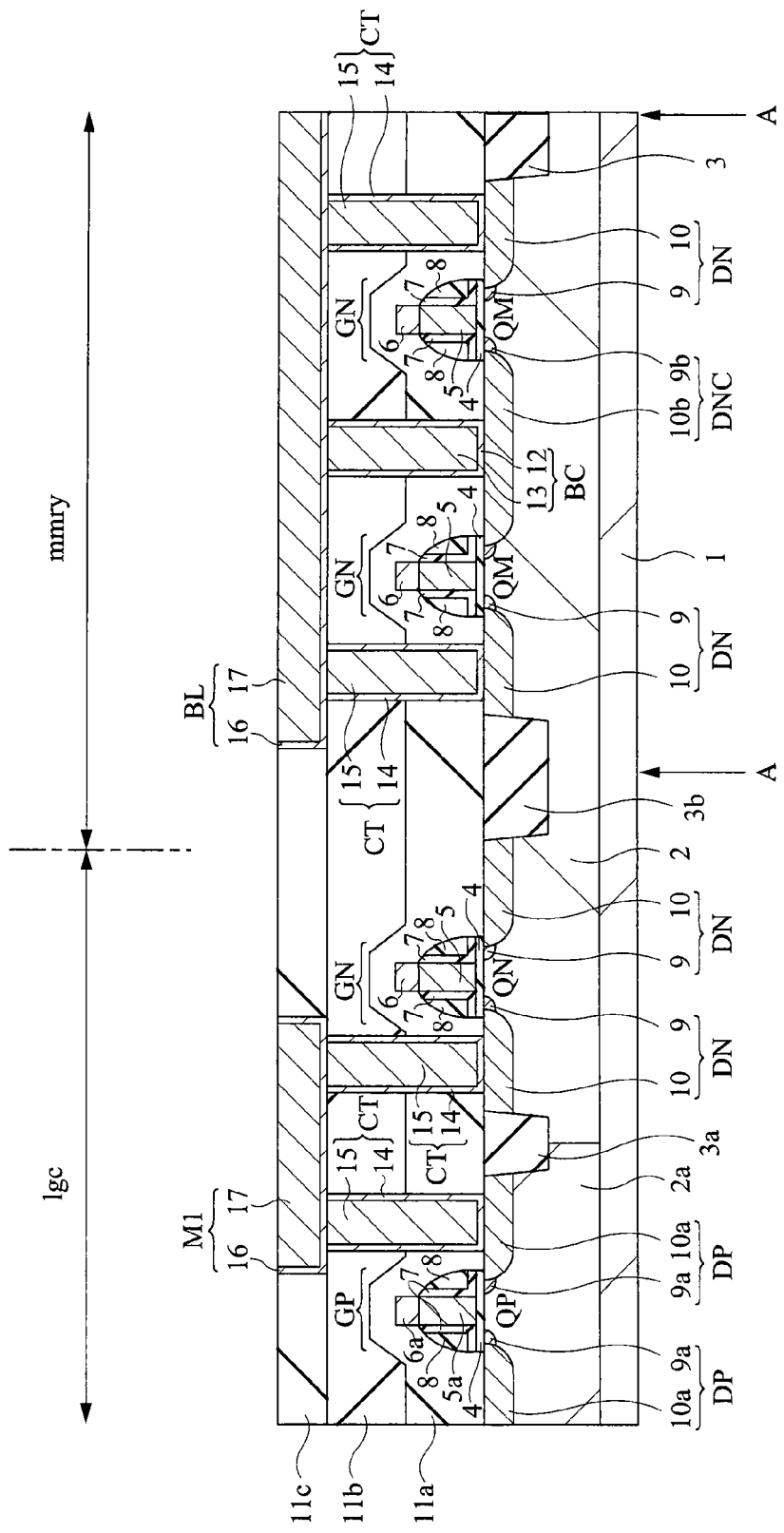
FIG. 14 is a cross-sectional view schematically showing the semiconductor device during the manufacturing process continued from FIG. 13.

Then, as shown in FIG. 14, an insulating film (not shown) made of, for example, silicon nitride is deposited on the entire surface, and is used as an etch-back stopper of the interlayer insulating film 11b. Next, after the interlayer insulating film 11c made of, for example, silicon oxide is deposited on the semiconductor substrate 1, a photoresist (not shown) for forming first-layer wirings and bit lines of the logic circuit is formed on the interlayer insulating film 11c. With using the photoresist as an etching mask, a first-layer wiring trench and a bit-line trench of the logic circuit through which the upper surface of the interlayer insulating film 11b is exposed are formed.

Next, the barrier metal film 16 made of, for example, titanium and titanium nitride is deposited by sputtering in this order from the lower layer. On the barrier metal film 16, the conductive film 17 made of, for example, tungsten is stacked by CVD. Then, the barrier metal film 16 and the conductive film 17 are etched back by using the known CMP until the upper surface of the interlayer insulating film 11c is exposed and the upper surfaces of the bit line BL and the first-layer wiring M1 in the trenches have the same height, thereby completely isolating the bit line BL and the first-layer wiring M1.

Figure 15:
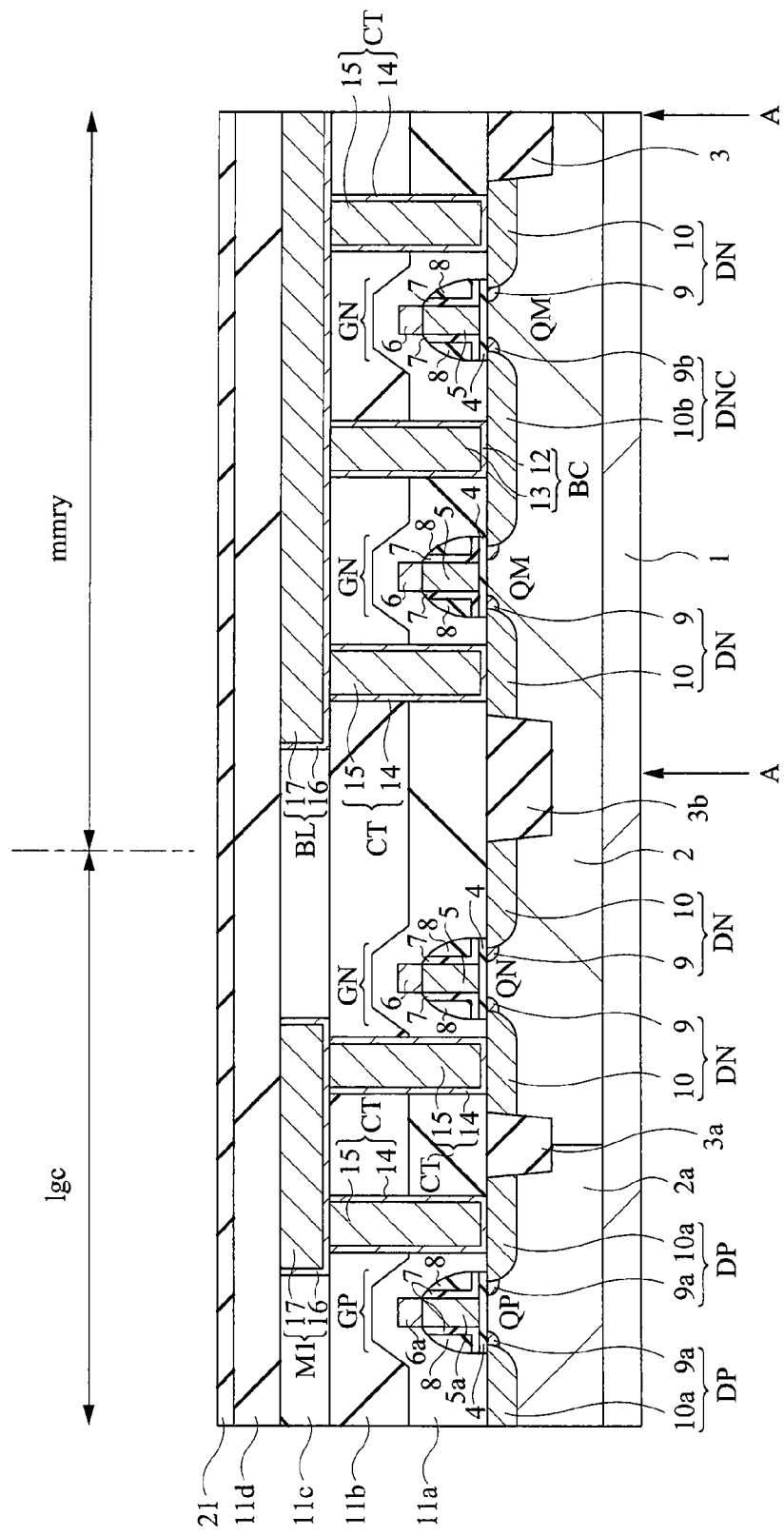
FIG. 15 is a cross-sectional view schematically showing the semiconductor device during the manufacturing process continued from FIG. 14.

Subsequently, as shown in FIG. 15, after the insulating film 11d made of, for example, silicon oxide is deposited, the peeling prevention film 21 made of, for example, oxide or nitride of a transition metal such as tantalum, titanium, or chromium or silicon nitride is deposited. By forming this peeling prevention film 21, for example, the chalcogenide-material storage layer 22 formed later is prevented from being peeled off from the lower electrode TP, the interlayer insulating film 11d, and others.

Figure 16:
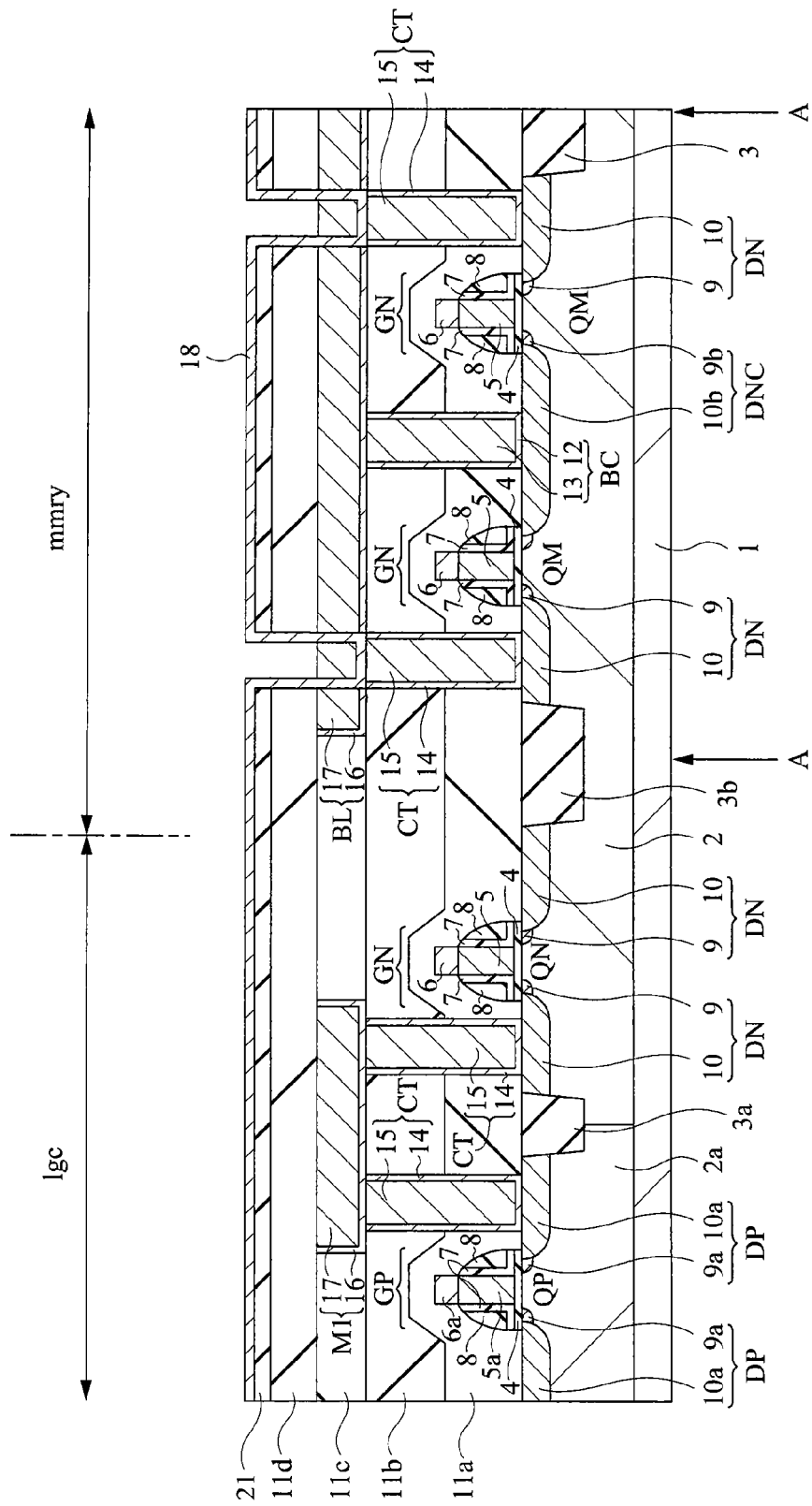
FIG. 16 is a cross-sectional view schematically showing the semiconductor device during the manufacturing process continued from FIG. 15.

Then, as shown in FIG. 16, through the lithography and dry etching process, holes are formed so as to expose the upper surfaces of the metal contacts CT of the memory cell region mmry, and then the spacer insulating film 18 made of, for example, silicon nitride is formed on the entire surface.

Figure 17:
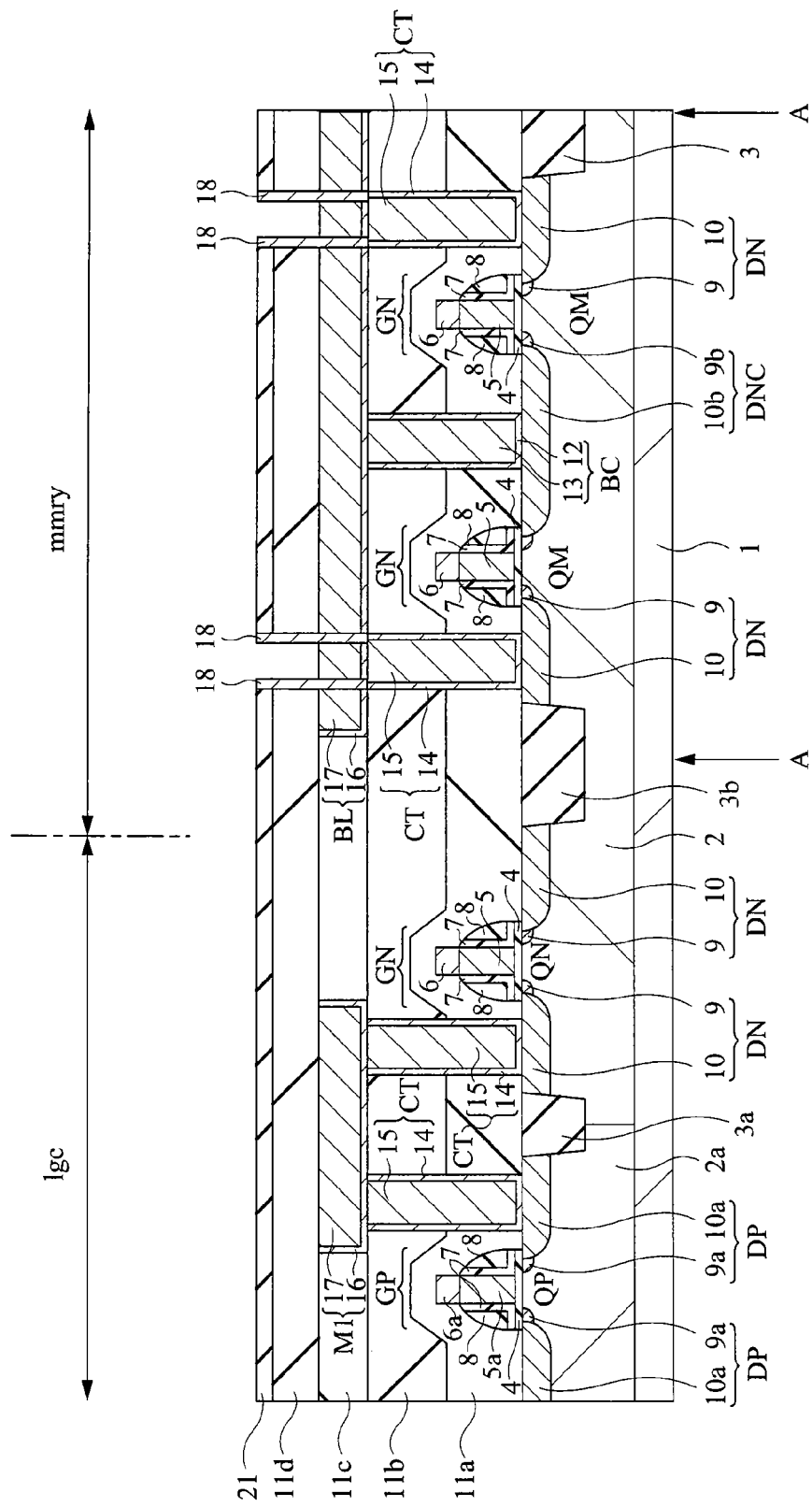
FIG. 17 is a cross-sectional view schematically showing the semiconductor device during the manufacturing process continued from FIG. 16.

Subsequently, as shown in FIG. 17, the spacer insulating film 18 is anisotropically etched-back to expose the upper surfaces of the metal contacts CT.

Figure 18:
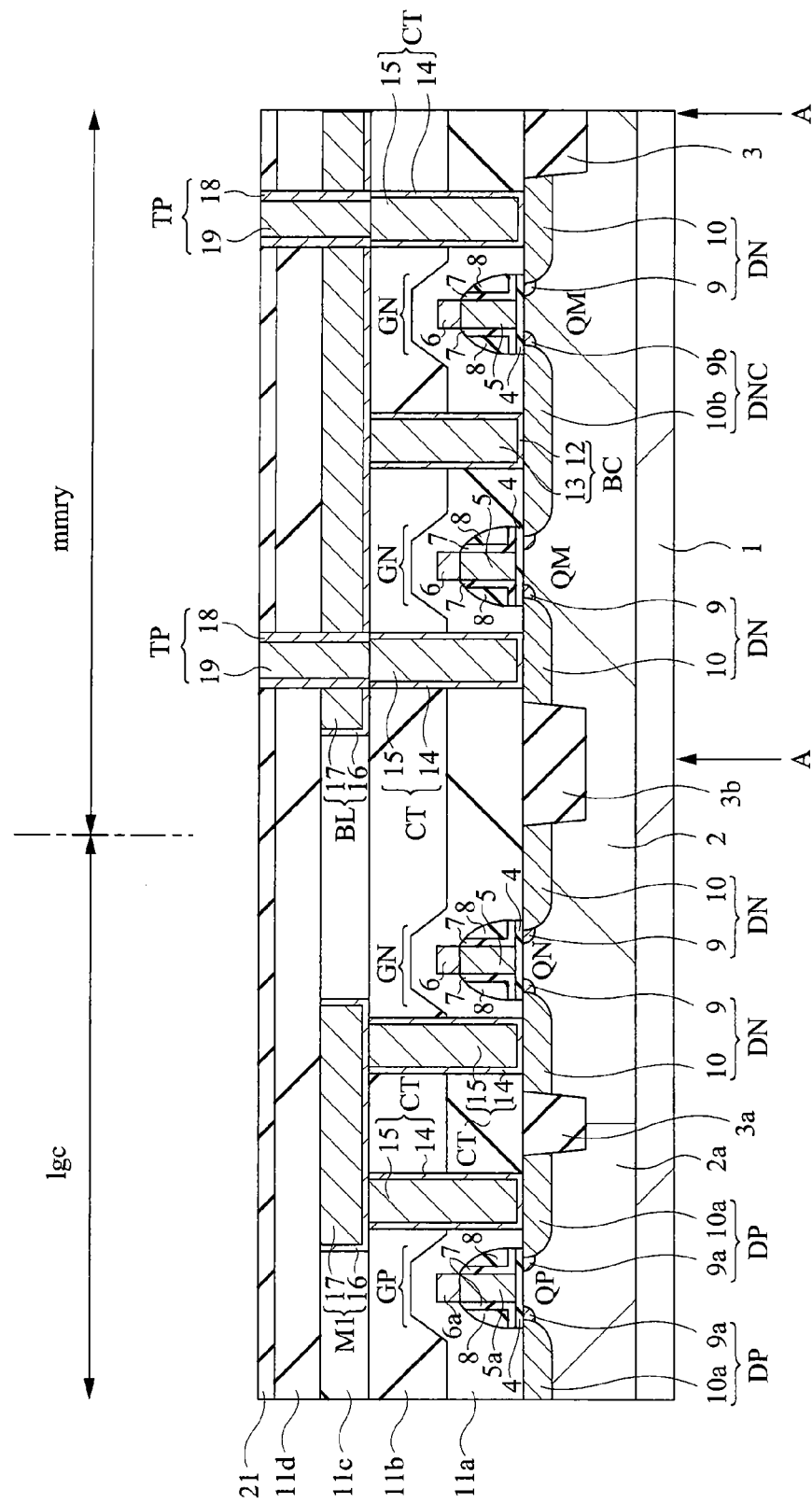
FIG. 18 is a cross-sectional view schematically showing the semiconductor device during the manufacturing process continued from FIG. 17.

Then, as shown in FIG. 18, a barrier metal (not shown) formed of, for example, a titanium film (film thickness: approximately 5 nm) and a titanium nitride film (film thickness: approximately 10 nm) is deposited by sputtering in this order from the lower layer. On this deposited film, the conductive film 19 made of, for example, tungsten is stacked by CVD to bury the connection holes. Then, the barrier metal film and the conductive film 19 are etched back by using the known CMP until the upper surface of the peeling prevention film 21 is exposed and the upper surfaces of the conductive films 19 in the connection holes and the peeling prevention film 21 have the same height, thereby completely isolating the conductive films 19 in the connection holes.

Figure 19:
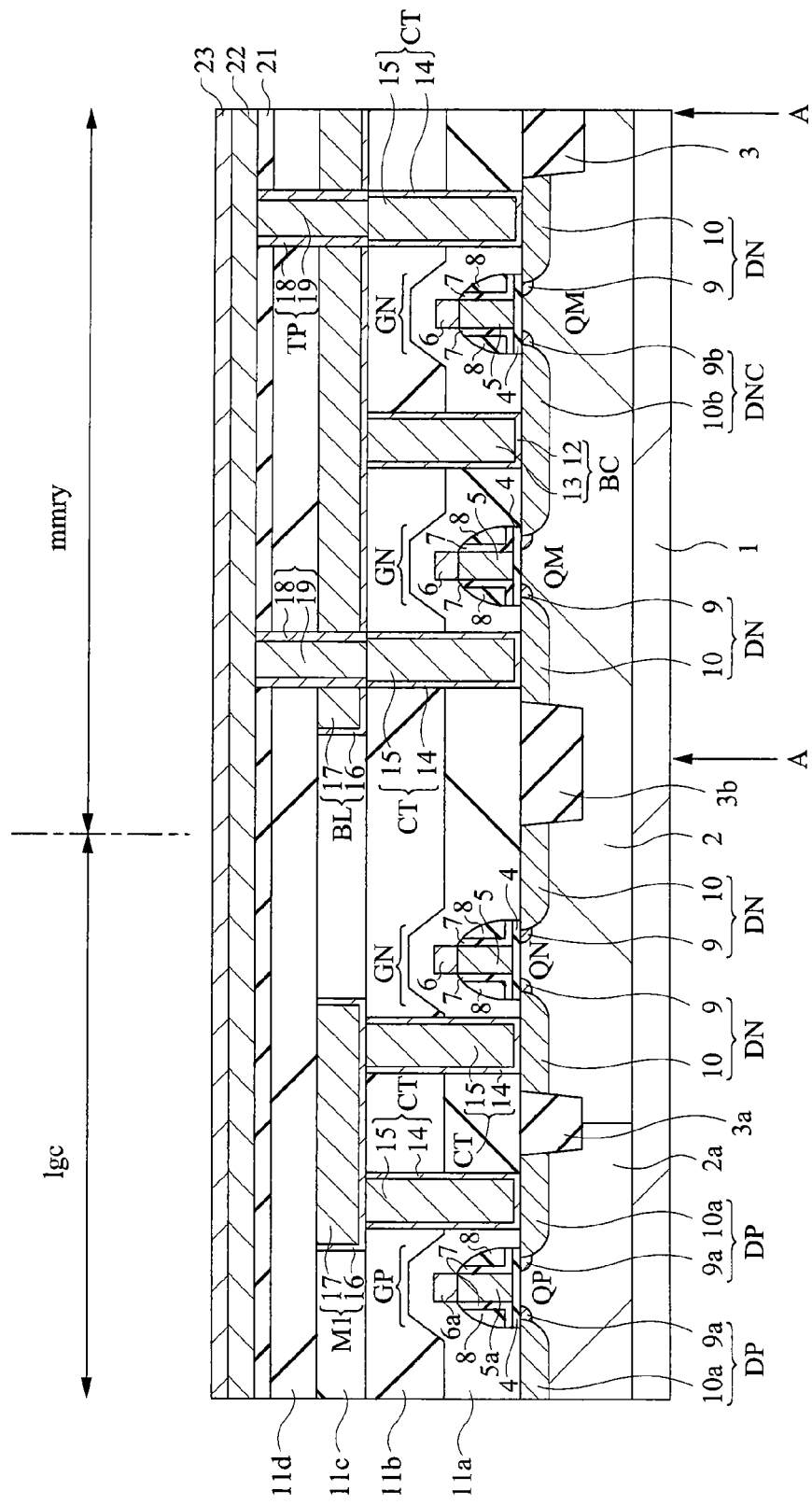
FIG. 19 is a cross-sectional view schematically showing the semiconductor device during the manufacturing process continued from FIG. 18.

Then, as shown in FIG. 19, the chalcogenide-material storage layer 22 and the upper plate 23 made of, for example, tungsten are sequentially deposited.

As another method, the process of forming the peeling prevention film 21, the chalcogenide-material storage layer 22, and the upper plate 23 after the formation of the lower electrode TP is also possible.

Figure 31:
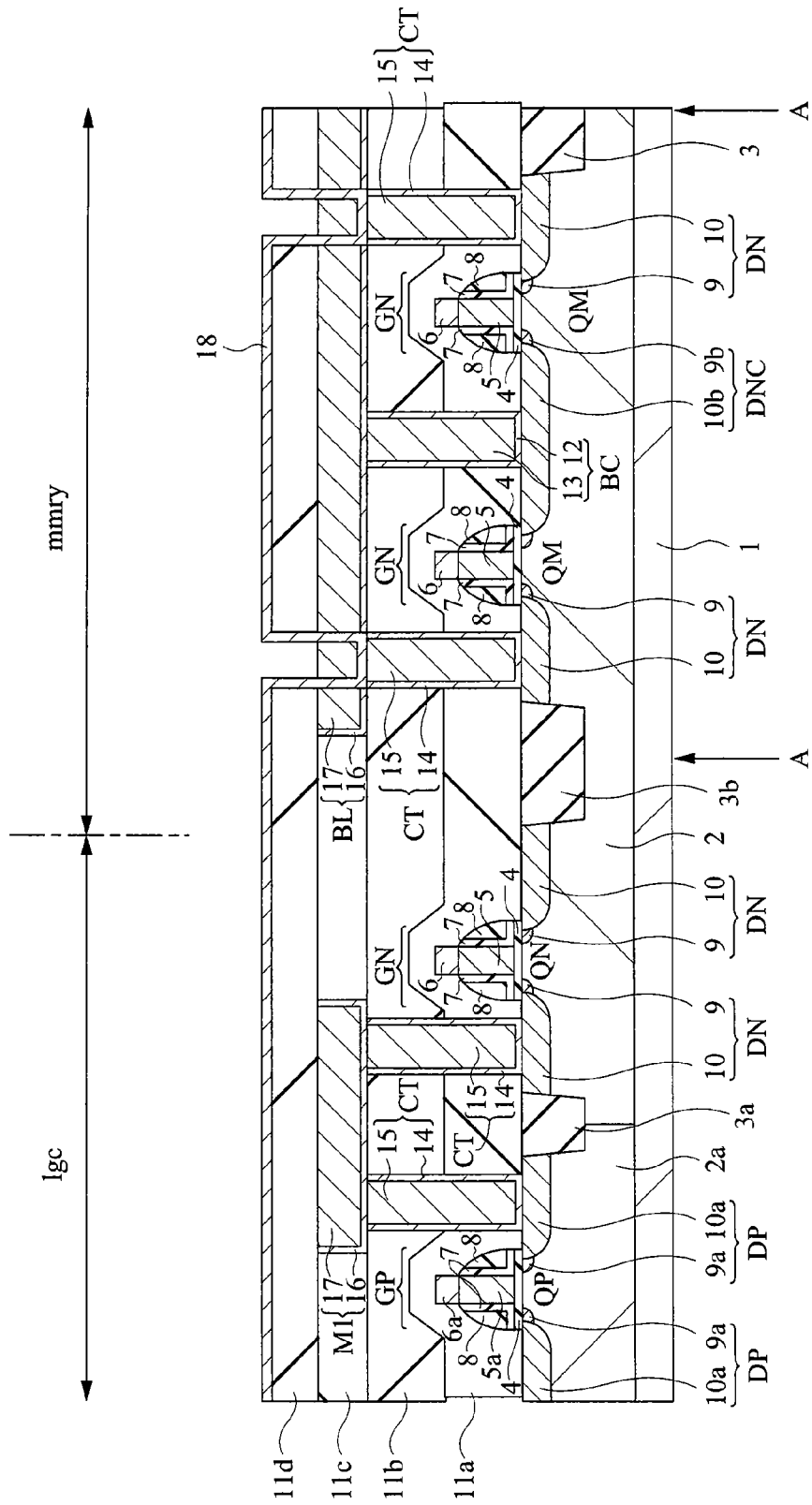
FIG. 31 is a cross-sectional view schematically showing the semiconductor device during the manufacturing process continued from FIG. 14.

More specifically, as shown in FIG. 31, after the formation of the interlayer insulating film 11d, through the lithography and dry etching, a hole through which the upper surface of the metal contact CT in the memory cell region mmry is exposed is formed, and then the spacer insulating film 18 made of, for example, silicon nitride is deposited on the entire surface.

Figure 32:
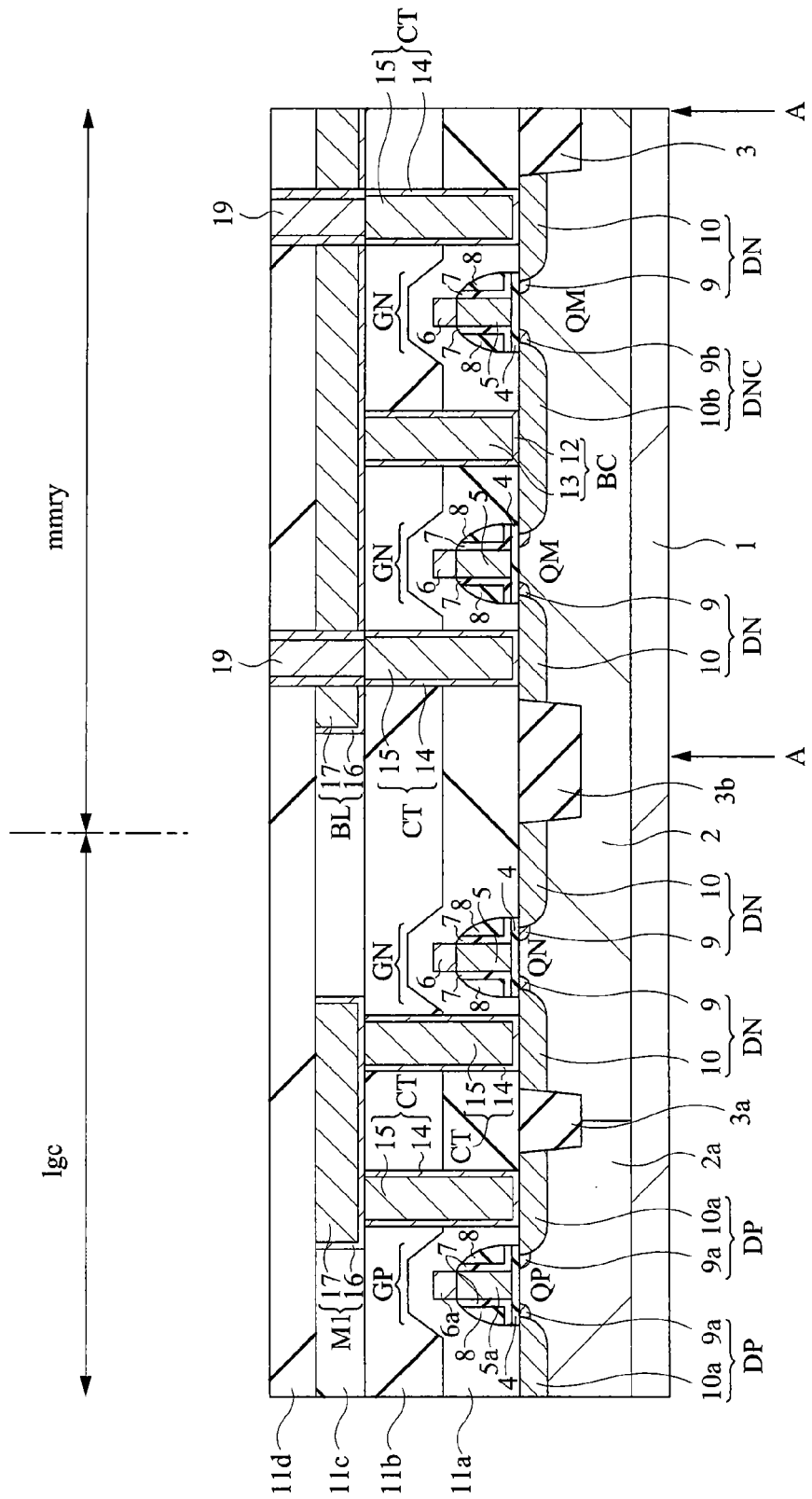
FIG. 32 is a cross-sectional view schematically showing the semiconductor device during the manufacturing process continued from FIG. 31.

Then, the spacer insulating film 18 is anisotropically etched back to expose the upper surface of the metal contact CT. Further, a barrier metal (not shown) formed of, for example, a titanium film (film thickness: approximately 5 nm) and a titanium nitride film (film thickness: approximately 10 nm) is deposited by sputtering in this order from the lower layer. On this deposited film, the conductive film 19 made of, for example, tungsten is stacked by CVD to bury the connection holes. The barrier metal film and the conductive film 19 are then etched back by using the known CMP until the upper surface of the interlayer insulating film 11d is exposed and the upper surfaces of the conductive films 19 in the connection holes and the interlayer insulating film 11d have the same height, thereby completely isolating the conductive films 19 and forming the structure as shown in FIG. 32.

Figure 33:
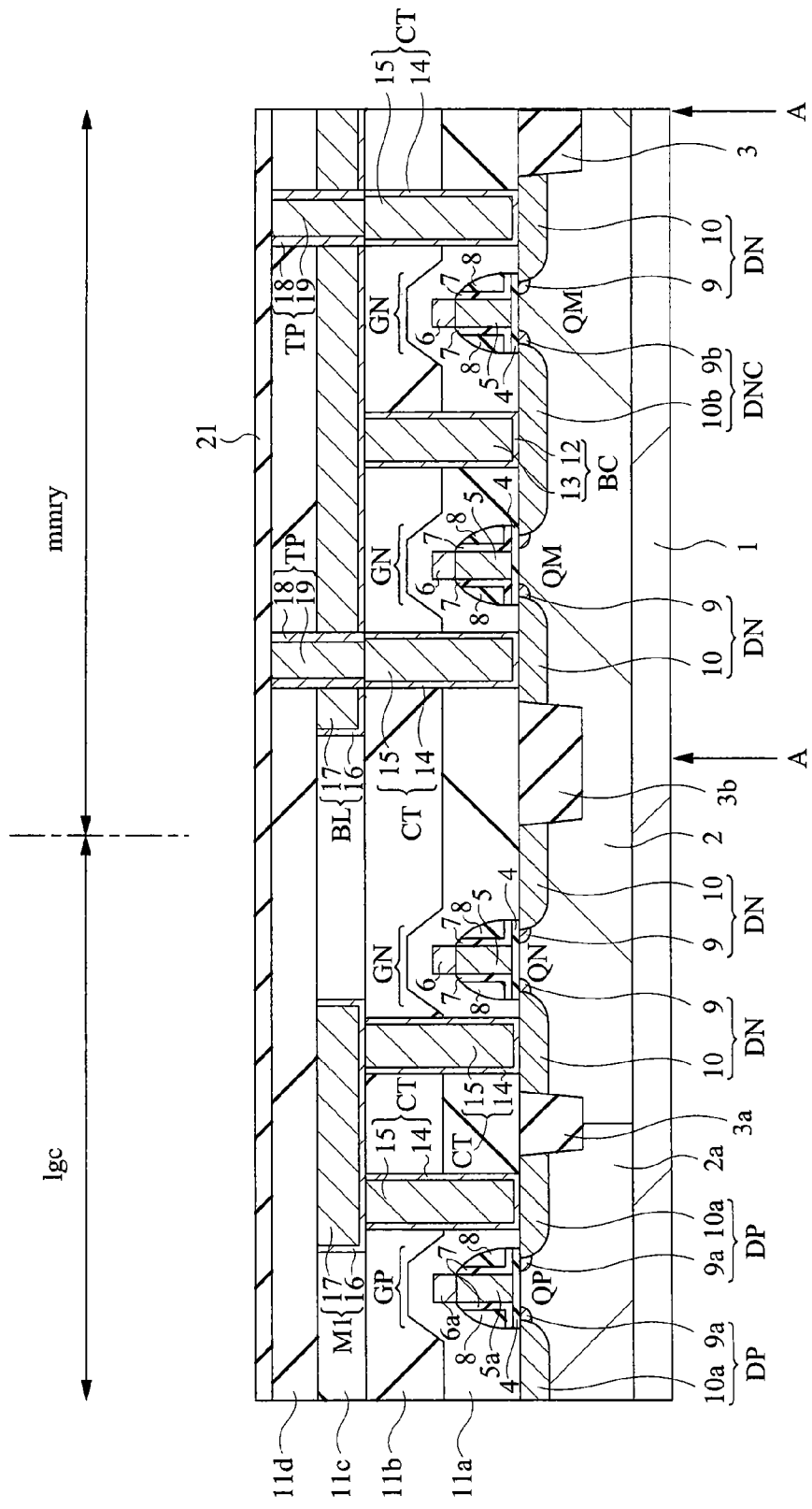
FIG. 33 is a cross-sectional view schematically showing the semiconductor device during the manufacturing process continued from FIG. 32.

Subsequently, as shown in FIG. 33, the peeling prevention film 21 made of, for example, oxide or nitride of a transition metal such as tantalum, titanium, or chromium or silicon nitride is deposited.

Figure 34:
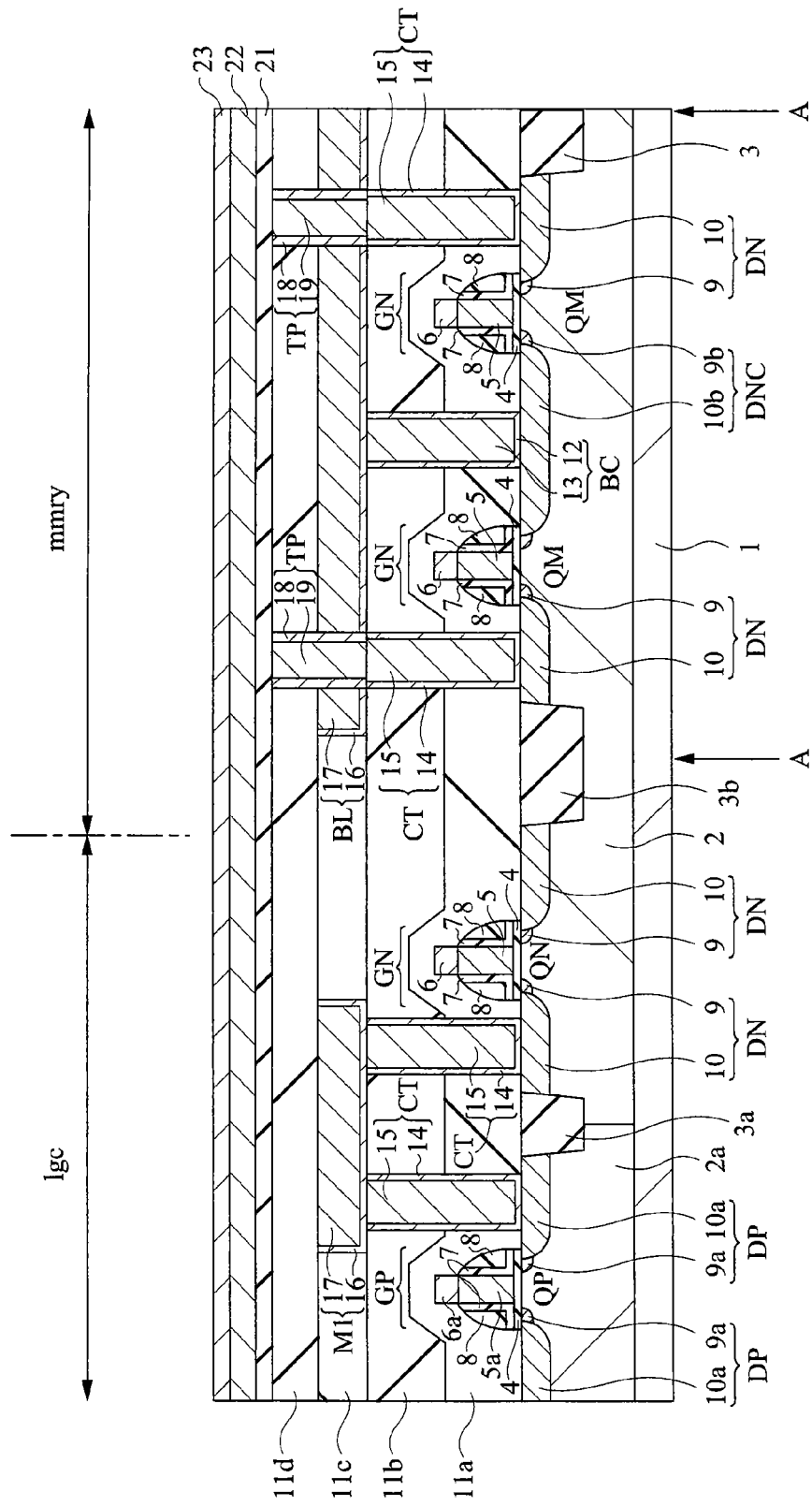
FIG. 34 is a cross-sectional view schematically showing the semiconductor device during the manufacturing process continued from FIG. 33.

Then, as shown in FIG. 34, the chalcogenide-material storage layer 22 and the upper plate 23 made of, for example, tungsten are sequentially deposited. When the chalcogenide-material storage layer is deposited on the structure of FIG. 33, the peeling prevention film 21 is interposed between the lower electrode TP and the chalcogenide-material storage layer 22, and owing to the presence of the high-resistance peeling prevention film 21, the effects that the phase-change region can be efficiently heated and a rewrite operation can be performed with a low-power pulse can be expected. Since the subsequent process in FIG. 34 is similar to that in FIG. 19, the description will be made with reference to FIG. 19.

As a method of forming the chalcogenide-material storage layer 22, the sputtering is suitable. In the sputtering, the film is formed using a single target material having a desired composition in general. However, it is also possible to use a plurality of target materials to form a film through the co-sputtering.

Since the sputtering yield differs depending on the elements, the composition of the target and the composition of the formed film may differ from each other in the case of a material with a complex composition, and there is the possibility that the composition of the film to be formed may be gradually changed when the target is repeatedly used. In such a case, it is more preferable to form a film by the co-sputtering using a plurality of targets with a relatively simple compound composition. Since the composition change is small in the target with a compound composition, even when the sputtering is performed many times, the composition of the film to be formed is not changed. Also, in the co-sputtering, the composition of the chalcogenide material can be adjusted by changing the input power of each target. Accordingly, various characteristics including a resistance value can be advantageously set to a desired value in accordance with the purpose of use thereof. In general, a distribution in composition in a film-thickness direction occurs to some degree by the film formation. However, if the average composition in the film-thickness direction is within the range of the present invention, the preferable characteristics can be achieved.

Also, as sputtering gas, inert gas such as Ar, Xe, or Kr or mixed gas obtained by adding nitrogen of several % to any of these gases can be used. When the nitrogen-mixed gas is used, not only the data retaining characteristic is improved, but also the crystal grains of the chalcogenide material become minute. As a result, it is possible to achieve the effect of decreasing variations in element characteristics caused by the variations of a relative positional relation between the connection hole of the lower electrode and the crystal grains.

Furthermore, in addition to the sputtering, an ion implantation method can be used. When the ion implantation method is used, a chalcogenide material can be formed by doping an element to a desired region or a desired depth of the chalcogenide material, and thus a chalcogenide-material storage layer having a composition change in a film-thickness direction can be formed. Still further, it is also possible to form the chalcogenide-material storage layer 22 having a composition change in a film-thickness direction by the sequential and repetitive film-formation method by the sputtering using a plurality of targets.

Figure 20:
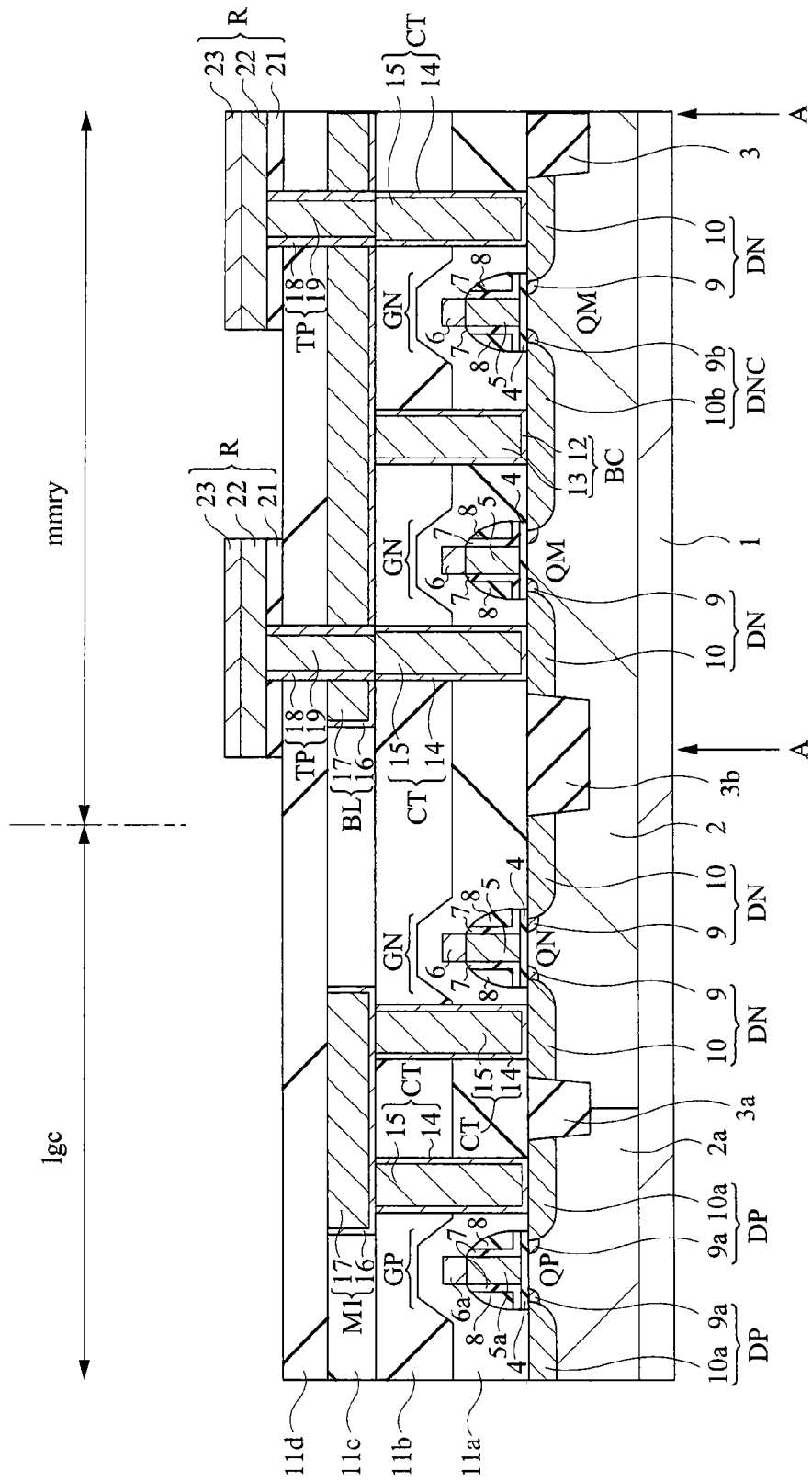
FIG. 20 is a cross-sectional view schematically showing the semiconductor device during the manufacturing process continued from FIG. 19.

Then, as shown in FIG. 20, the peeling prevention film 21, the chalcogenide-material storage layer 22, and the upper plate 23 are processed to form the memory element R.

Figure 21:
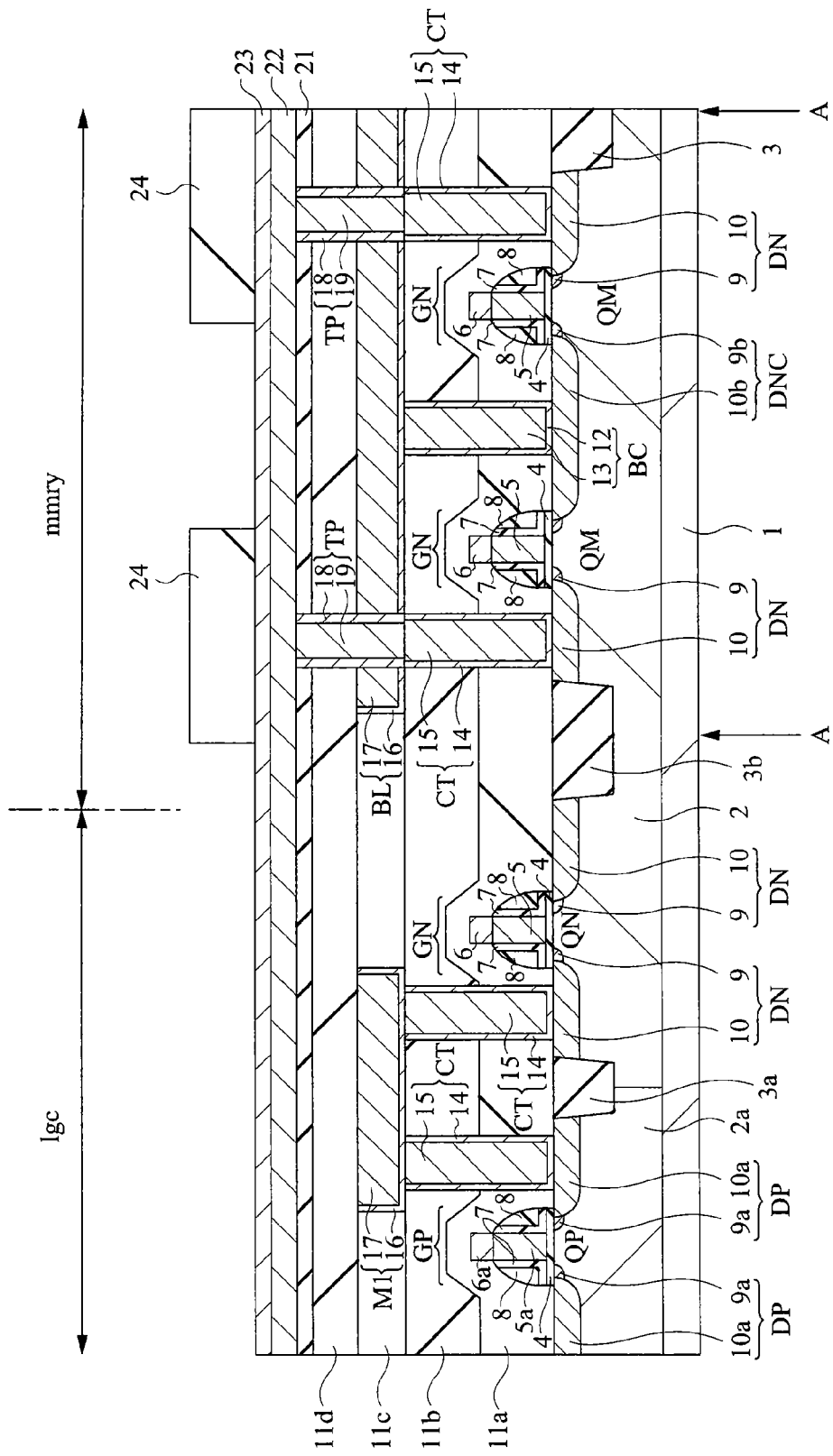
FIG. 21 is a cross-sectional view schematically showing the semiconductor device during the manufacturing process continued from FIG. 20.
Figure 22:
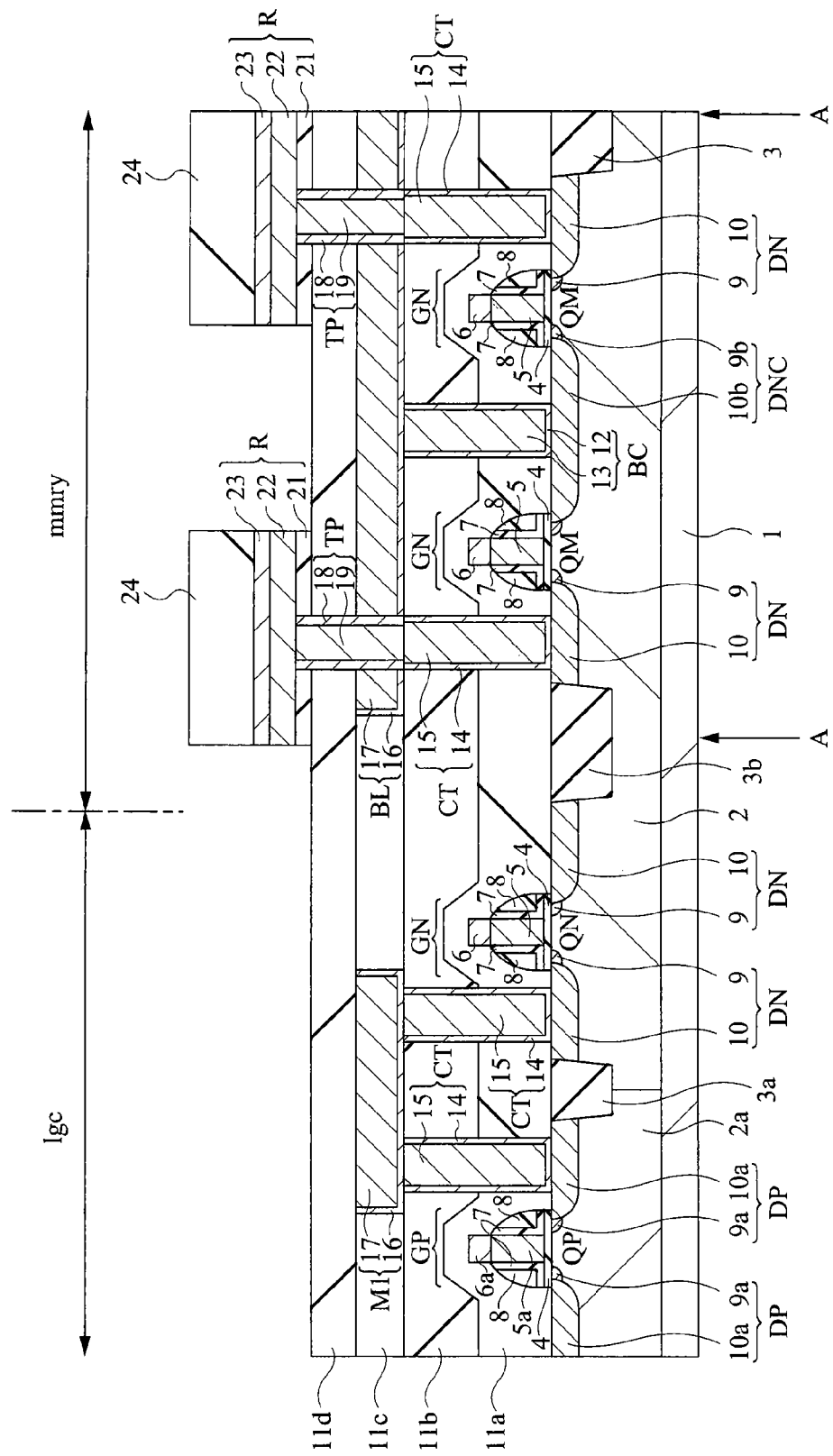
FIG. 22 is a cross-sectional view schematically showing the semiconductor device during the manufacturing process continued from FIG. 21.

Here, in the element isolation processing of this memory element R, an insulating film can be used as a hard mask. As shown in FIG. 21, after an insulating film 24 is further deposited on the upper plate 23 of FIG. 19, a pattern is transferred by lithography, and the insulating film 24 is processed by dry etching with using a photoresist as an etching mask. Thereafter, the photoresist is removed by ashing. Subsequently, as shown in FIG. 22, the peeling prevention film 21, the chalcogenide-material storage layer 22, and the upper plate 23 are etched using the insulating film 24 as a hard mask. If etching is performed using the resist as a mask, the residues of the etching reaction product from the chalcogenide material and the resist are attached to the processed sidewalls, and it is difficult to remove the attached residues by ashing and cleaning. Therefore, the process using the insulating film 24 as a hard mask is desired. Since the subsequent process in FIG. 20 is similar to that in FIG. 22, the subsequent manufacturing method will be described with reference to FIG. 20.

Figure 23:
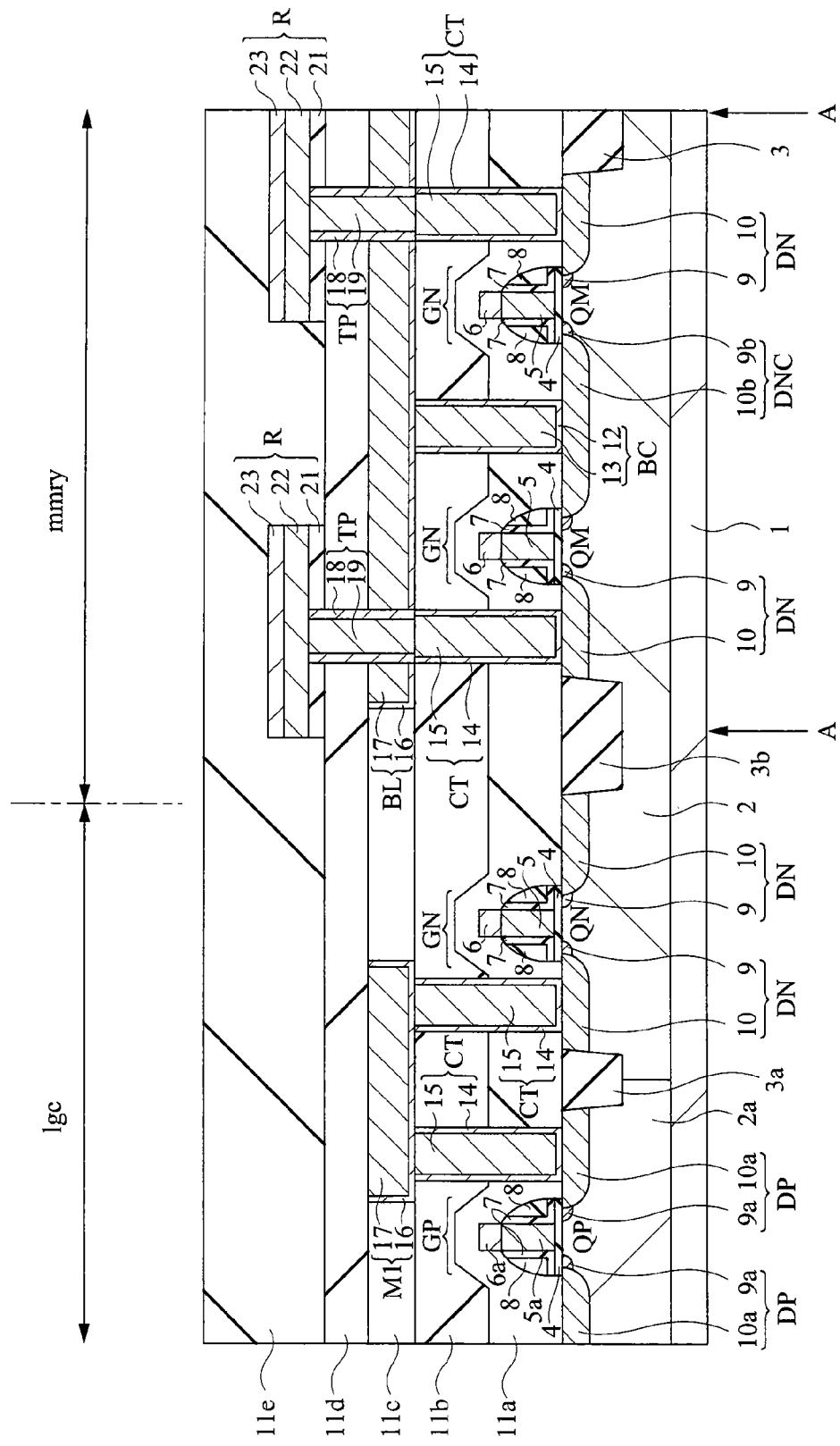
FIG. 23 is a cross-sectional view schematically showing the semiconductor device during the manufacturing process continued from FIG. 22.

Then, as shown in FIG. 23, the interlayer insulating film 11e is deposited so as to cover the memory element R.

Figure 24:
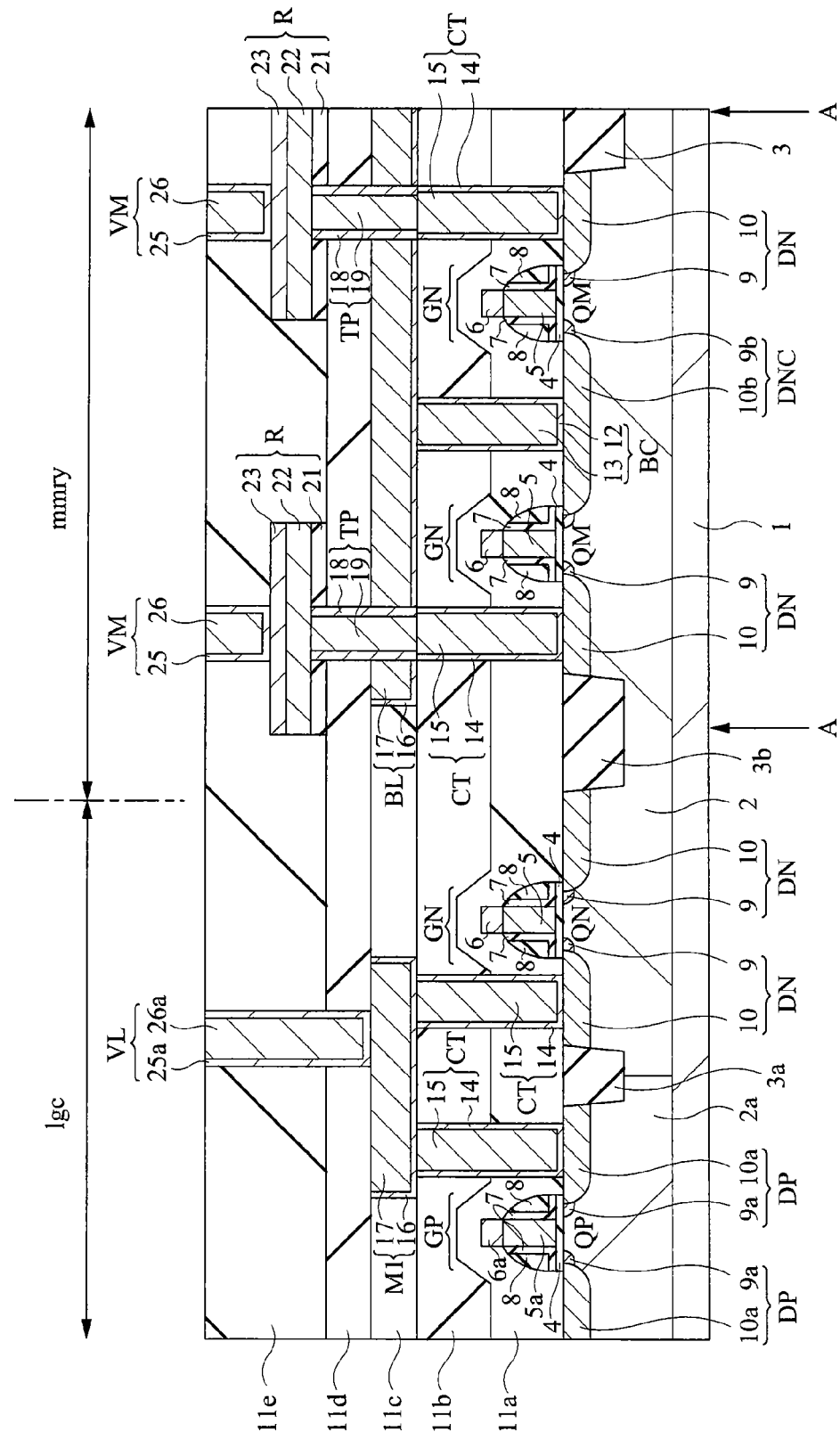
FIG. 24 is a cross-sectional view schematically showing the semiconductor device during the manufacturing process continued from FIG. 23.
Figure 25:
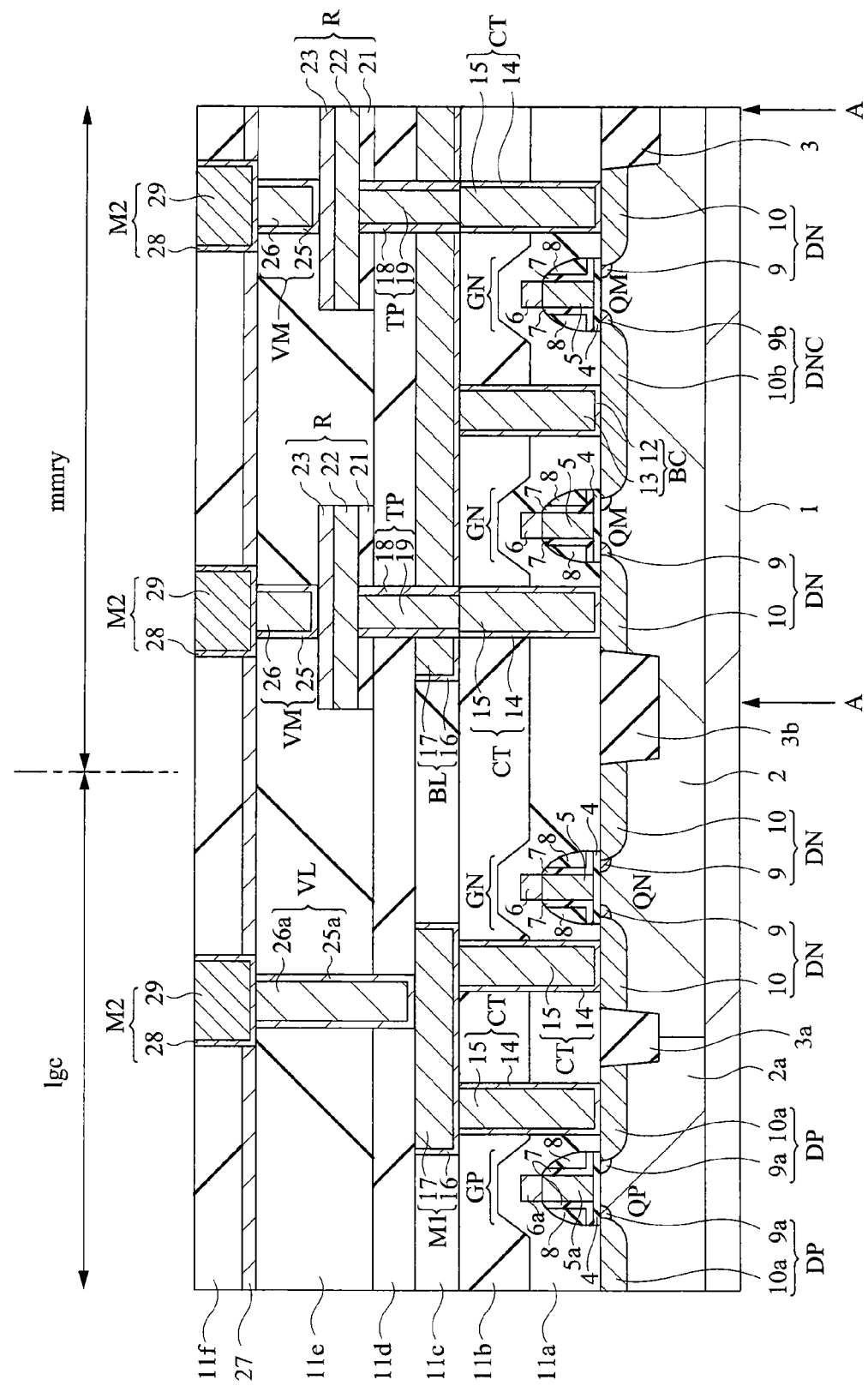
FIG. 25 is a cross-sectional view schematically showing the semiconductor device during the manufacturing process continued from FIG. 24.

Thereafter, as shown in FIG. 24, through the lithography and dry etching process, connection holes are formed (opened) in the interlayer insulating film 11e in the memory cell region mmry, and a connection hole is formed (opened) in the interlayer insulating films 11d and 11e in the logic circuit region lgc, and then the barrier metal 25 and the conductive film 26 are sequentially deposited. By this means, these connection holes are buried, and then the barrier metal 25 and the conductive film 26 are etched back until the upper surface of the interlayer insulating film 11e is exposed and the upper surfaces of the conductive films 26 in the holes and the interlayer insulating film 11e have the same height, thereby completely isolating the vias VM in the memory cell region mmry and the via VL in the logic circuit region lgc.

Then, as shown in FIG. 25, after a barrier film 27 for copper wiring and the interlayer insulating film 11f are deposited on the surface, through the lithography and dry etching process, wiring trenches are formed (opened) in the interlayer insulating film 11f, and the barrier metal 28 and the conductive film 29 made of, for example, copper are sequentially deposited to bury the wiring trenches. Next, the barrier metal 28 and the conductive film 29 are etched back until the upper surface of the interlayer insulating film 11f is exposed and the upper surfaces of the metal wirings in the trenches and the interlayer insulating film 11f have the same height, thereby forming the second-layer wirings M2.

A plurality of wiring layers (not shown) are formed on the second-layer wiring M2 by using a known method. Thereafter, by performing the hydrogen annealing at about 400° C. to 450° C., a semiconductor device is completed.

Before actually storing information in the completed semiconductor device, an initialization process is performed to the semiconductor device by applying a voltage to each memory element R. In this initialization process, a snap back (rapid resistance drop) is caused by a pulse longer than the pulse of a set operation and the phase-change region (memory operation region) and its surroundings are heated for a relatively long time, so that the film is once put into a state having a resistance lower than that before the process. By this initialization process, a region (phase-change region) in which crystal grains seem to be formed is obtained in a portion of the chalcogenide-material storage layer 22 on the upper portion of the lower electrode TP, and a high-resistance state (reset) and a low-resistance state (set) can be stably repeated within a desired pulse-width range. If a process of irradiating laser light of high energy under appropriate conditions immediately after the formation of the chalcogenide-material storage layer is performed in the manufacturing procedure, the above-described initialization process by applying a long pulse voltage can be omitted. In this case, when information is actually stored in the memory element R for the first time, a high-resistance state set by a reset pulse and a low-resistance state set by a set pulse are preferably repeated several times in advance.

Next, the configuration of the memory cell array according to the first embodiment of the present invention will be specifically described with reference to FIG. 26 and FIG. 27.

Figure 26:
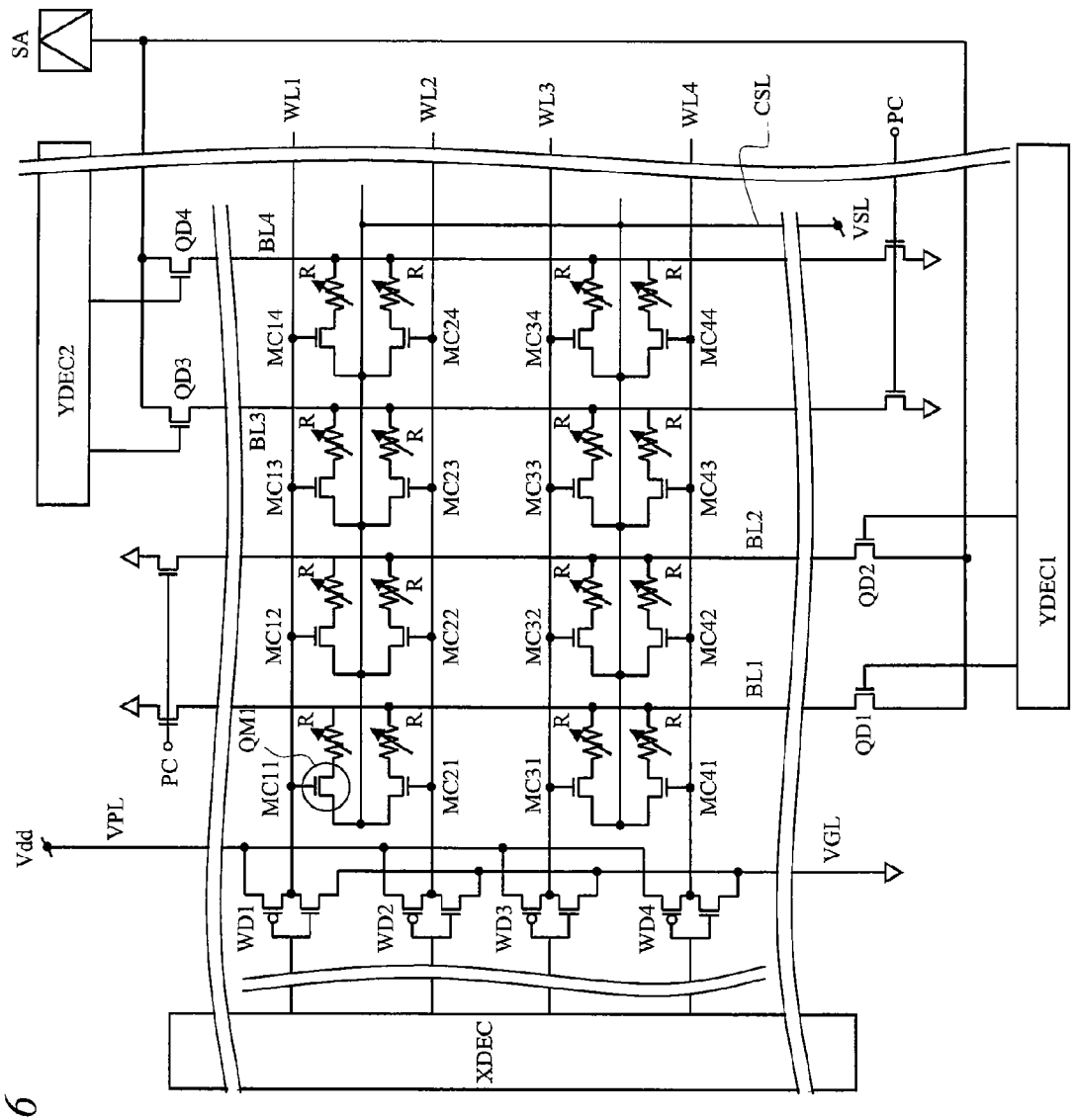
FIG. 26 is a circuit diagram of the configuration of the memory cell array according to the embodiment of the present invention.

FIG. 26 is a circuit diagram of the memory cell array according to the first embodiment of the present invention. FIG. 27 is a layout diagram corresponding to FIG. 26. Note that, for the purpose of avoiding complexity, FIG. 26 and FIG. 27 show only a part of the array including four word lines WL1 to WL4 and four bit lines BL1 to BL4.

The configuration of the memory cell array according to the first embodiment of the present invention is known as a NOR type, which is suitable for storing a system program because it can execute the high-speed reading. Therefore, this is used for a single memory chip or for mixed mounting with a logic LSI such as microcomputer.

Memory cells MC11 to MC14 are electrically connected to the word line WL1. Similarly, memory cells MC21 to MC24, MC31 to MC34, and MC41 to MC44 are electrically connected to the word lines WL2 to WL4, respectively. Also, the memory cells MC11 to MC41 are electrically connected to the bit line BL1. Similarly, the memory cells MC12 to MC42, MC13 to MC43, and MC14 to MC44 are electrically connected to the bit lines BL2, BL3, and BL4, respectively.

Each memory cell MC includes one MIS transistor QM and one memory element R connected in series thereto. Each word line WL is electrically connected to the gate of the MIS transistor QM constituting each memory cell MC. Each bit line BL is electrically connected to the memory element R constituting each memory cell MC.

Word drivers WD1 to WD4 drive the word lines WL1 to WL4, respectively. A signal from the X address decoder XDEC determines which word driver WD is to be chosen. Here, a reference character VPL denotes a power supply line to each word driver WD, Vdd denotes a power supply voltage, and VGL denotes a potential extraction line of each word driver. Here, the potential extraction line VGL is fixed at the ground potential.

A select transistor QD1 is a MIS transistor that pre-charges the bit line BL1. Similarly, select transistors QD2 to QD4 are MIS transistors that pre-charge the bit lines BL2 to BL4, respectively. Each select transistor QD is selected via a Y address decoder YDEC1 or YDEC2 in accordance with an address input. In the first embodiment, YDEC1 and YDEC2 alternately handle every two bit lines BL to be selected. An output by reading is detected by a sense amplifier SA.

Figure 27:
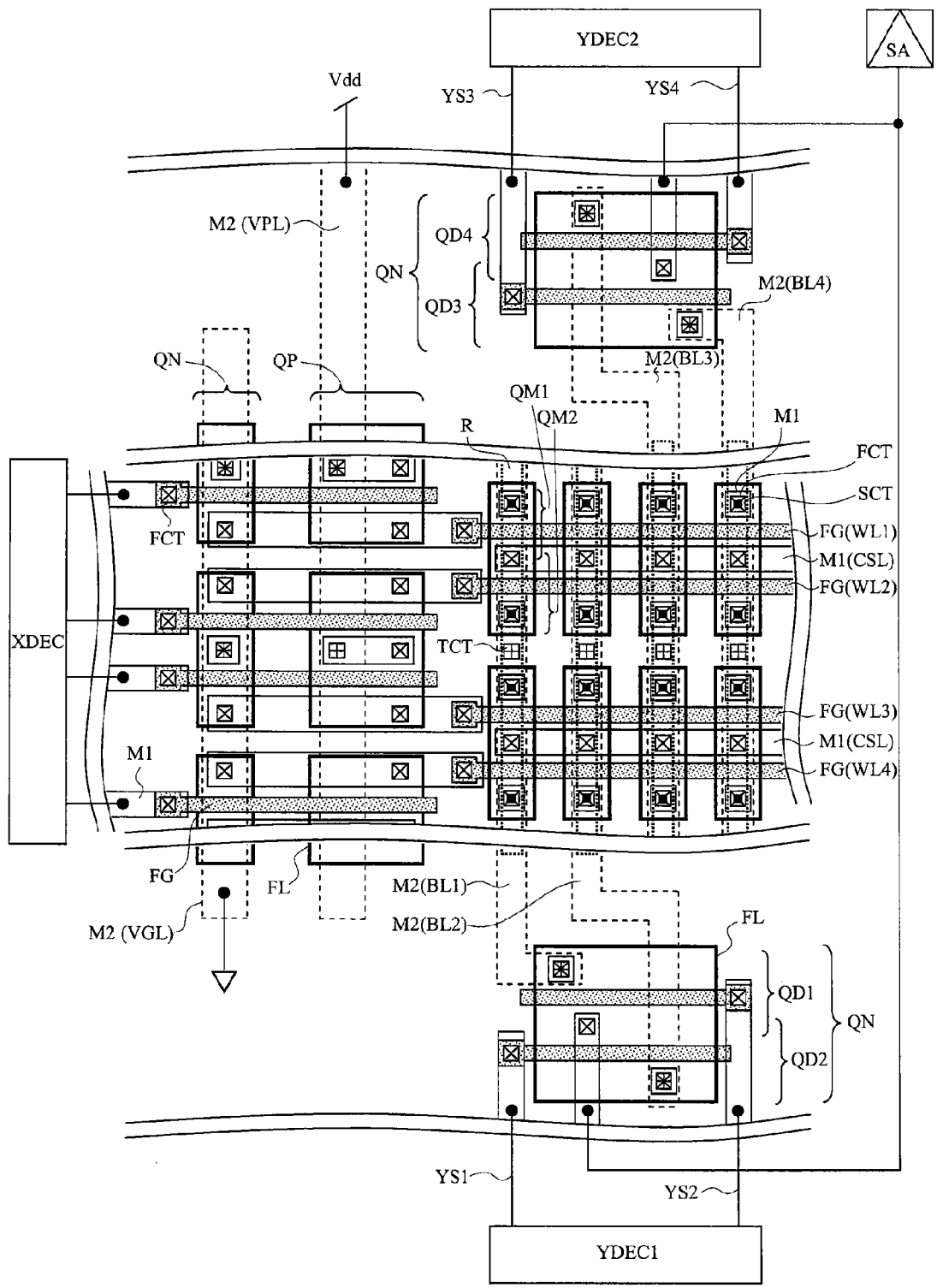
FIG. 27 is a layout diagram corresponding to the configuration of the memory cell array of FIG. 26.

In FIG. 27, a reference character FL denotes an active region, M1 denotes a first-layer wiring, M2 denotes a second-layer wiring, and FG denotes a gate electrode layer used as a gate of the MIS transistor formed on a silicon substrate. Also, a reference character FCT denotes a contact hole connecting the upper surface of the active region FL and the lower surface of the first-layer wiring M1, SCT denotes a contact hole connecting the upper surface of the first-layer wiring M1 and the lower surface of the memory element R, and TCT denotes a contact hole connecting the upper surface of the first-layer wiring M1 and the lower surface of the second-layer wiring M2.

The memory element R is led up to the second-layer wiring M2 via the contact hole TCT between the memory cells MC electrically connected to the same bit line BL. This second layer wiring M2 is used as each bit line BL. The word lines WL1 to WL4 are formed of gate electrode layers FG. A stacked layer of polysilicon and silicide (alloy of silicon and high-melting-point metal) or the like is used for the gate electrode layer FG. In the memory cell MC, for example, the MIS transistor QM2 constituting the memory cell MC21 shares a source region with the MIS transistor QM1.

The bit lines BL1 to BL4 are connected to the source side of the select transistors QD1 to QD4 disposed on the outer periphery of the memory cell array. The select transistors QD1 and QD2 share the same drain region, and the select transistors QD3 and QD4 share the same drain region. These select transistors QD have a function to pre-charge each bit line BL. At the same time, these select transistors QD select a specified bit line in response to a signal from the Y address decoder YDEC1 or YDEC2. Note that, in the first embodiment, the select transistors QD are of an n channel type.

The circuit elements constituting each block in the first embodiment are not particularly limited, but are typically formed on one semiconductor substrate made of single crystal silicon by a known semiconductor integrated circuit technology for a CMIS (complementary MIS transistor). Furthermore, a chalcogenide material and the like whose atomic arrangement is changed by the pulse application are formed by an integrated circuit manufacturing technology in a hybrid manner. The known photolithography and dry etching can be used for the patterning of these patterns.

Second Embodiment

The chalcogenide-material storage layer 22 of the memory element R according to the first embodiment is made of a phase-change material containing at least either one of indium (In) or gallium (Ga), germanium (Ge), antimony (Sb), and tellurium (Te) at an appropriate composition ratio. In the second embodiment, the case where 10 atom % or smaller of the constituent elements of the chalcogenide-material storage layer 22 is replaced by nitrogen will be described. Note that, since the second embodiment is similar to the first embodiment except that 10 atom % or smaller of the constituent elements is replaced by nitrogen, the description of redundant parts will be omitted.

When a part of the constituent elements of the chalcogenide material made of at least either one of indium or gallium, germanium, antimony, and tellurium is replaced by nitrogen, there are such advantages that the data retaining characteristic at high temperature is improved, and the crystal grains become minute and variations in characteristics can be decreased.

The chalcogenide-material storage layer 22 according to the second embodiment is formed by the sputtering, for example, the co-sputtering using inert gas such as Ar, Xe, or Kr as described in the first embodiment, and nitrogen gas is mixed to the inert gas in its formation.

Figure 28:
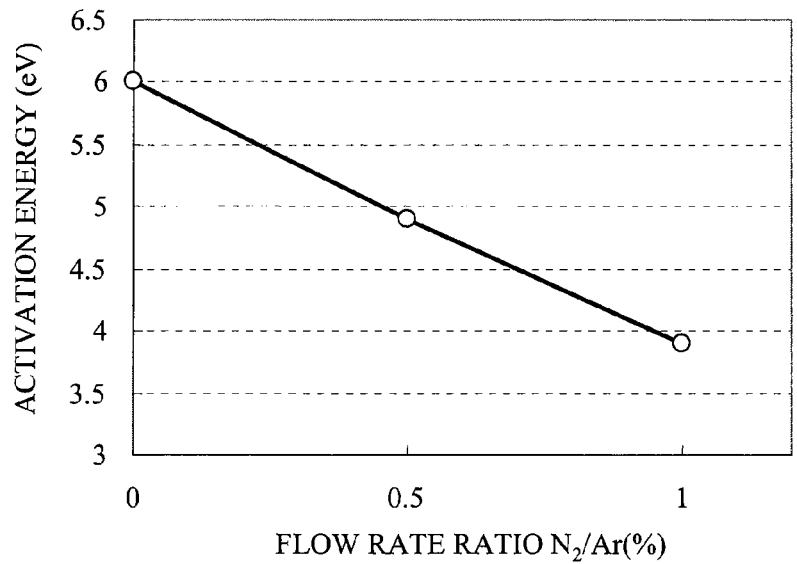
FIG. 28 is an explanatory diagram showing activation energy for crystallization of a chalcogenide-material storage layer according to the second embodiment of the present invention.

FIG. 28 shows the activation energy for crystallization of a film made of the chalcogenide material and formed by the sputtering using Ar gas mixed with nitrogen gas. When nitrogen is added, activation energy for crystallization is decreased. This is because crystallization at a high temperature is suppressed. Note that the data retaining characteristic in an operation temperature range is not deteriorated.

Therefore, in the memory element R according to the second embodiment, while the data retaining characteristic in the normal operation temperature range is maintained, the data retaining life at higher temperature is improved. In this case, for example, an effect for withstanding the heat load in a mounting process in which the temperature becomes higher than an actual use environment temperature can be achieved. However, if the amount of nitrogen is too large, since a change in characteristics by rewriting is large, the amount of nitrogen is preferably set at 10 atom % or smaller.

Third Embodiment

Figure 29:
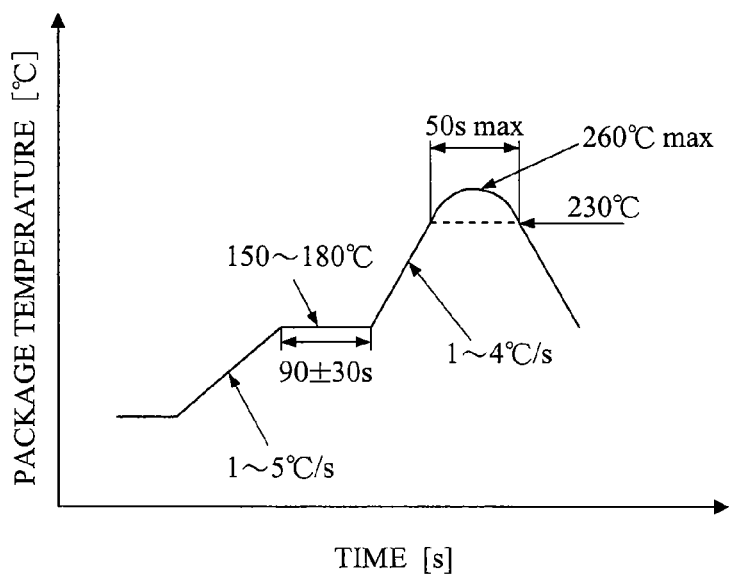
FIG. 29 is an explanatory diagram showing a temperature profile in a soldering reflow process for a semiconductor device according to the third embodiment of the present invention.
Figure 30:
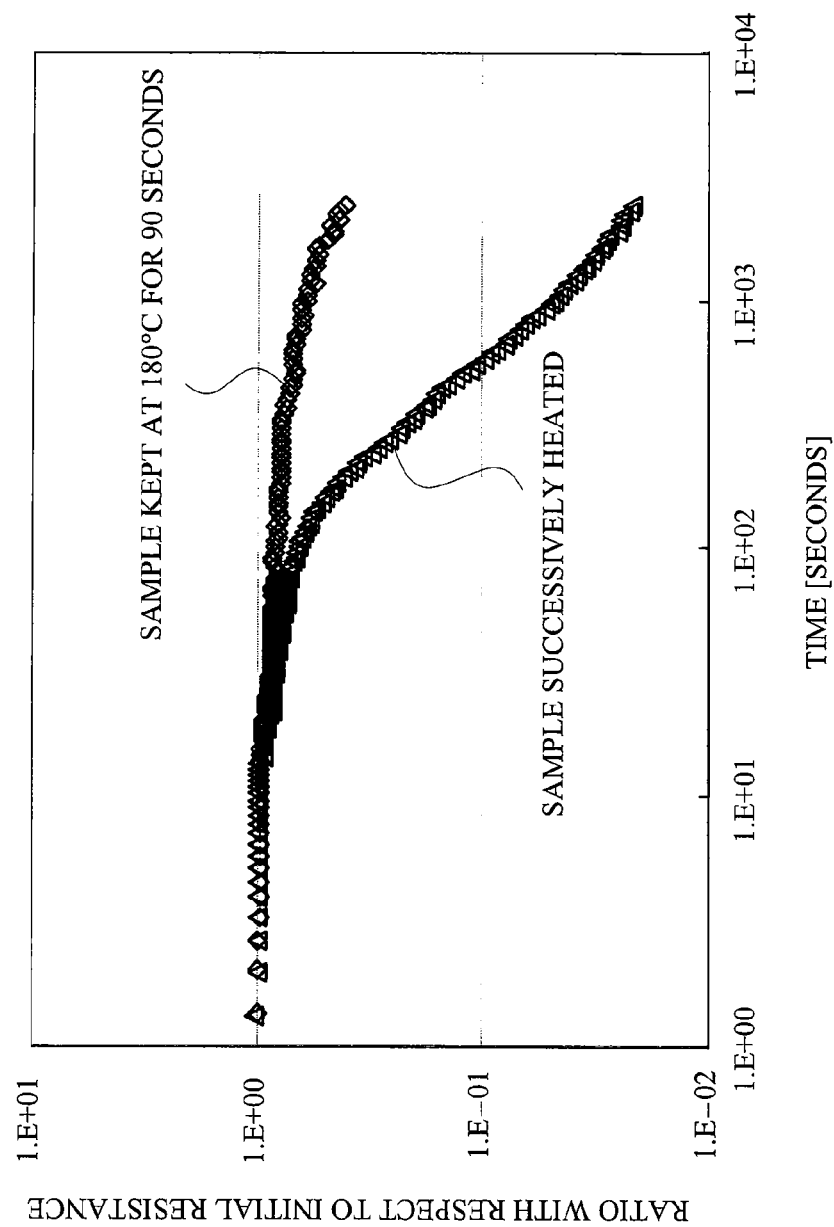
FIG. 30 is an explanatory diagram showing a data retaining characteristic of the semiconductor device according to the third embodiment.

A semiconductor device according to the third embodiment is obtained by performing a temperature treatment for the semiconductor device according to the first or second embodiment. In the third embodiment, the temperature treatment in a mounting process will be described with reference to FIG. 29 and FIG. 30. FIG. 29 is an explanatory diagram showing a temperature profile in a soldering reflow process. FIG. 30 is an explanatory diagram showing a data retaining characteristic in the case where a thermal pretreatment of the soldering reflow process is performed.

When a semiconductor device such as a microcomputer provided with the memory elements R is to be mounted, for example, a soldering reflow process is performed. When lead-free soldering is used, the temperature for the reflow process is about 260° C. at maximum. In other words, the semiconductor device provided with the memory elements R is exposed under a temperature environment much higher than the normal operation environment.

However, as shown in FIG. 29, when the semiconductor device is retained at a relatively high temperature within a range not exceeding the crystallization temperature of the chalcogenide material for a predetermined period of time, the high-resistance state is further stabilized. This is probably because the crystal-nucleus generation site becomes inactive and the crystallization is difficult to proceed, and this has the feature that the data retaining characteristic is further improved.

FIG. 30 shows the decrease of the resistance in a reset state from an initial value with respect to the two samples including one which is temporarily kept at 180° C. for 90 seconds and then heated to 260° C. and the other which is directly heated to 260° C. without being kept, in the mounting process by the lead-free soldering reflow. According to the results shown in FIG. 30, the resistance of the sample through the mounting process is hard to be lowered. Therefore, the semiconductor device that has been placed under an environment with a temperature profile in which the temperature is kept for a predetermined period of time at a relatively low temperature considered to be lower than the crystallization temperature of the chalcogenide-material storage layer and is then increased to a peak temperature higher than the crystallization temperature is provided with the memory elements R suitable for the mounting process.

According to the present invention, a highly-reliable non-volatile memory device which can maintain a memory state even in a soldering reflow process and has a high resistance ratio and an excellent data retaining characteristic even at high temperature can be achieved. The memory element according to the present invention can also be used even under such a high-temperature environment as in a microcomputer for controlling an automobile engine.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the entire region that is involved in a memory operation does not have to be uniformly in an amorphous state or a crystalline state, and crystal grains may be present in a region in an amorphous state or an amorphous portion may be present in a region in a crystalline state. In other words, it does not matter if the change occurs between a state with a relatively large amount of amorphous portions and a state with a relatively small amount of amorphous portions and the resistance value is changed.

The fact that the chalcogenide material with the composition according to the present invention is a material in which crystallization with crystal nucleation occurs instead of crystal growth from an amorphous region can be known from the structure of the film. When the chalcogenide-material layer is observed through a scanning electron microscope (SEM) or a transmission electron microscope (TEM) and is seen as three grains at maximum, more preferably, six grains at maximum in a film-thickness direction, the material can be determined as a material in which crystallization with crystal nucleation occurs. Also, in this material, even within the composition range of the present invention, not only the phase change but also the resistance change occur depending on the composition in some cases due to the formation and disappearance of a conductive path made of a high-condensation region of the metal or semi-metal atoms or an atomic group containing them moved by an electric field. In other words, it is not always necessary to employ only the phase change by the crystal nucleation and growth from nuclei as a set mechanism if the crystal growth from outside to inside, which becomes difficult by the addition of indium (In), is not employed as the set mechanism.

Furthermore, it is not always necessary to achieve the concentration of 10.5 atom % or larger to 40 atom % or smaller by only one of indium (In) and gallium (GA), but the concentration of 10.5 atom % or larger to 40 atom % or smaller may be achieved by mixing both In and Ga.

INDUSTRIAL APPLICABILITY

The present invention is widely used in manufacturing industries for manufacturing a semiconductor device provided with a memory element containing a chalcogenide material.

The invention claimed is:

1. A semiconductor device in which a memory element having a storage layer and electrodes formed on both sides of the storage layer is formed on a semiconductor substrate,
   wherein the storage layer is made of a material containing:
   at least either one of gallium or indium of 10.5 atom % or larger to 40 atom % or smaller;
   germanium of 5 atom % or larger to 35 atom % or smaller;
   antimony of 5 atom % or larger to 25 atom % or smaller; and
   tellurium of 40 atom % or larger to 65 atom % or smaller.

2. The semiconductor device according to claim 1, wherein 20 atom % or smaller of the tellurium is replaced by selenium.

3. The semiconductor device according to claim 1, wherein 10 atom % or smaller of all constituent elements of the storage layer is replaced by nitrogen.

4. The semiconductor device according to claim 1, wherein the number of atoms of the germanium is larger than the number of atoms of the antimony.

5. The semiconductor device according to claim 1, wherein an insulating film or a high-resistance film is provided on one surface of the storage layer.

6. The semiconductor device according to claim 1, wherein the storage layer has a composition change in a film-thickness direction due to formation by co-sputtering or a sequential and repetitive film-formation method using a plurality of targets.

7. The storage device according to claim 1, wherein the information is stored by a high-resistance state with a high electric resistance value and a low-resistance state with a low electric resistance value of the storage layer, and
   the electric resistance value in the high-resistance state is 5 MΩ or higher at room temperature.

8. The storage device according to claim 1,
wherein the information is stored by a high-resistance state with a high electric resistance value and a low-resistance state with a low electric resistance value of the storage layer, and
the electric resistance value in the high-resistance state is 500 kΩ or higher at 130° C.

9. The semiconductor device according to claim 1,
wherein the information is stored by a high-resistance state with a high electric resistance value and a low-resistance state with a low electric resistance value of the storage layer, and
the electric resistance value in the high-resistance state and the electric resistance value in the low-resistance state have a ratio of 100 to 1 or more at 130° C.

10. The semiconductor device according to claim 1,
wherein the number of atoms of the antimony is larger than the number of atoms of the germanium.

11. The semiconductor device according to claim 1,
Wherein the semiconductor element is constructed to maintain during and after a mounting process a current memory state of the memory element same as prior to said mounting process and wherein said mounting process is a soldering reflow process.

12. A semiconductor device having a memory element, the memory element comprising:
a chalcogenide-material storage layer storing information by changing an atomic arrangement; and
electrodes formed on both surfaces of the chalcogenide-material storage layer,
wherein the information is stored by a high-resistance state with a high electric resistance value and a low-resistance state with a low electric resistance value of the chalcogenide-material storage layer, and
the chalcogenide-material storage layer contains at least either one of gallium or indium of 10.5 atom % or larger, and the number of atoms of tellurium is larger than the number of atoms of antimony.

13. A semiconductor device having a memory cell array in which a plurality of memory elements each having a storage layer that stores a high-resistance state with a high electric resistance value and a low-resistance state with a low electric resistance value by a phase change between a crystalline phase and an amorphous phase are disposed in a matrix,
wherein the memory cell array is formed on a semiconductor substrate together with a semiconductor integrated circuit,
the storage layer contains at least either one of indium or gallium, germanium, antimony, and tellurium,
the number of atoms of the tellurium of the storage layer is larger than the number of atoms of the antimony, and
the storage layer contains 10.5 atom % or larger of the indium or gallium.

14. The semiconductor device according to claim 13,
wherein the memory cell array includes a plurality of MIS transistors for selecting the plurality of memory elements, a plurality of word lines, and a plurality of bit lines,
a gate of the MIS transistor is electrically connected to the word line, and
one of a drain and a source of the MIS transistor is electrically connected to the memory element, and the other of the drain and the source is electrically connected to the bit line.

15. The semiconductor device according to claim 14,
wherein the memory element is put in the high resistance state by applying a first pulse to the memory element selected by the MIS transistor, and the memory element is put in the low-resistance state by applying a second pulse, and
the second pulse is longer than the first pulse in time.

16. The semiconductor device according to claim 13,
wherein the storage layer is constructed to change from an amorphous phase to a crystalline phase in accordance with a nucleation process.

17. The semiconductor device according to claim 13,
wherein at least either one of the indium or gallium is 10.5 atom % or larger to 40 atom % or smaller,
the germanium is 5 atom % or larger to 35 atom % or smaller,
the antimony is 5 atom % or larger to 25 atom % or smaller, and
the tellurium is 40 atom % or larger to 65 atom % or smaller.

18. The semiconductor device according to claim 16,
wherein 10 atom % or smaller of all constituent elements of the storage layer is replaced by nitrogen.

19. The semiconductor device according to claim 13,
wherein the electric resistance value in the high-resistance state and the electric resistance value in the low-resistance state have a ratio of 100 to 1 or more at 130° C.

20. The semiconductor device according to claim 12,
wherein the chalcogenide-material storage layer further contains germanium of 5 atom % or larger to 35 atom % or smaller, antimony of 5 atom % or larger to 25 atom % or smaller, and tellurium of 40 atom % or larger to 65 atom % or smaller, and
the electric resistance value in the high-resistance state and the electric resistance value in the low-resistance state have a ratio of 1000 to 1 or more at room temperature.

* * * * *